United States Patent
Xu et al.

(10) Patent No.: US 11,749,999 B2
(45) Date of Patent: Sep. 5, 2023

(54) BATTERY UNIT, BATTERY PACK, ELECTRICAL DEVICE, METHOD AND APPARATUS FOR MANUFACTURING BATTERY UNIT, AND METHOD FOR CONTROLLING BATTERY UNIT

(71) Applicant: CONTEMPORARY AMPEREX TECHNOLOGY CO., LIMITED, Fujian (CN)

(72) Inventors: Xiaofu Xu, Fujian (CN); Yonghuang Ye, Fujian (CN); Xinyu Zhang, Fujian (CN); Jianfu Pan, Fujian (CN); Qian Liu, Fujian (CN); Quanguo Li, Fujian (CN)

(73) Assignee: CONTEMPORARY AMPEREX TECHNOLOGY CO., LIMITED, Fujian (CN)

( * ) Notice: Subject to any disclaimer, the term of this patent is extended or adjusted under 35 U.S.C. 154(b) by 0 days.

(21) Appl. No.: 18/125,143

(22) Filed: Mar. 23, 2023

(65) Prior Publication Data
US 2023/0231390 A1   Jul. 20, 2023

Related U.S. Application Data

(63) Continuation of application No. PCT/CN2021/131688, filed on Nov. 19, 2021.

(51) Int. Cl.
*H02J 7/00* (2006.01)
*H01M 4/525* (2010.01)
(Continued)

(52) U.S. Cl.
CPC .......... *H02J 7/0016* (2013.01); *H01M 4/131* (2013.01); *H01M 4/525* (2013.01);
(Continued)

(58) Field of Classification Search
None
See application file for complete search history.

(56) References Cited

U.S. PATENT DOCUMENTS

2005/0106464 A1   5/2005   Yoshida et al.

FOREIGN PATENT DOCUMENTS

| CN | 1619875 A | 5/2005 |
|---|---|---|
| CN | 113594560 A | 11/2021 |

(Continued)

OTHER PUBLICATIONS

International Search Report and Written Opinion dated Aug. 1, 2022, received for PCT Application PCT/CN2021/131688, filed on Nov. 19, 2021, 16 pages including English Translation.

*Primary Examiner* — Carlos Barcena
(74) *Attorney, Agent, or Firm* — XSENSUS LLP

(57) ABSTRACT

A battery unit may comprise a first cell type and a second cell type electrically connected at least in series, wherein the first cell type may include N first cells, the second cell type may include M second cells, and N and M are positive integers; the first cell may have a discharge cell balance rate of CB1, the second cell may have a discharge cell balance rate of CB2, with $0.5 \leq CB1 \leq CB2 \leq 1.4$, and when the battery unit is charged to 95%-100% of the state of charge, the first cell may have a corresponding open-circuit voltage change rate of not greater than 0.005 V/% SOC, and the second cell type may have a corresponding open-circuit voltage change rate greater than that of the first cell.

14 Claims, 9 Drawing Sheets

(51) Int. Cl.
*H01M 4/131* (2010.01)
*H01M 50/51* (2021.01)
*H01M 10/44* (2006.01)

(52) U.S. Cl.
CPC ......... *H01M 10/446* (2013.01); *H01M 50/51* (2021.01); *H02J 7/0048* (2020.01)

(56) References Cited

FOREIGN PATENT DOCUMENTS

| | | |
|---|---|---|
| CN | 113594635 A | 11/2021 |
| JP | 10-189035 A | 7/1998 |
| JP | 2009-266706 A | 11/2009 |

BATTERY UNIT, BATTERY PACK, ELECTRICAL DEVICE, METHOD AND APPARATUS FOR MANUFACTURING BATTERY UNIT, AND METHOD FOR CONTROLLING BATTERY UNIT

CROSS-REFERENCE TO RELATED APPLICATION

The present application is a continuation of International Application No. PCT/CN2021/131688, filed Nov. 19, 2021, which is incorporated herein by reference in its entirety.

TECHNICAL FIELD

The present application relates to the technical field of energy storage devices, in particular to a battery unit, a battery pack, an electrical device, a method and an apparatus for manufacturing a battery unit, and a method for controlling a battery unit.

BACKGROUND ART

Secondary batteries have the advantages such as a small volume, a high energy density, a high power density, many cycles of use and a long storage time, and are widely used in some electronic apparatus, electric vehicles, electric toys and electric apparatus, such as mobile phones, notebook computers, battery cars, electric cars, electric planes, electric ships, electric toy cars, electric toy ships, electric toy planes and electric tools, etc. Secondary batteries are used as power drive power sources for new energy vehicles or large-capacity storage units for energy storage power stations, and therefore multiple single cells usually need to be connected in series or in parallel to obtain a battery unit and battery pack with a higher volumetric energy density.

For a cell in a battery unit, there is a need to prolong the service life. In order to meet this demand, it is necessary to compensate for the service life (capacity) of a cell; in this regard, there are usually two modes: a high-end area (i.e., a high SOC area) retention and a low-end area (i.e., a low SOC area) retention.

SUMMARY OF THE DISCLOSURE

However, some systems (such as lithium iron phosphate) have a cell with an SOC-OCV curve having a relatively large plateau area. a long-term non-use of the high-end area (i.e., a high SOC area) may lead to the decreased prediction accuracy of a BMS (a battery management system) for SOC. For example, in the conventional ampere-hour integration method for calculating the SOC sampling errors of the voltage and current will gradually accumulate, resulting in a wrong determination of the SOC.

In view of the above problems in the prior art, the present application is provided and an objective of the present application is to provide a battery unit, in which at least one indicative cell is included for the indication for a working cell and for a control such that the charging of the battery unit is stopped when the BMS detects that the state of charge SOC2 value of the indicative cell reaches the specified SOC value of a high-end area during the charging of the battery unit, and the state of charge of the battery unit at this time is the state of full charge, such that the accumulated error of the ampere-hour integration method can be prevented and the overall SOC prediction accuracy of the battery unit can be improved; and by means of keeping the capacity of the high-end area (i.e., the high SOC area) from release, the working cell can be designed with a smaller discharge cell balance rate (CB value); thus, the service life (capacity) compensation can be achieved while saving the amount of negative electrode graphite, which can further improve the energy density of the battery unit.

In addition, in the present application, the anodes of the working cell and the indicative cell are designed to be similar anodes, such that the service life (capacity) compensation levels of the working cell and the indicative cell can be basically the same, and the decay rates of the working cell and the indicative cell can be basically the same, which can prevent the buckets effect of the battery unit affecting the overall capacity.

In a first aspect, the present application provides a battery unit, comprising a first cell type and a second cell type electrically connected at least in series, wherein the first cell type include N first cells, the second cell type include M second cells, and N and M are positive integers; the first cell has a discharge cell balance rate of CB1, the second cell has a discharge cell balance rate of CB2, with $0.5 \leq CB1 \leq CB2 \leq 1.4$, and when the battery unit is charged to 95%-100% of the state of charge, the first cell has a corresponding open-circuit voltage change rate of not greater than 0.005 V/% SOC, and the second cell type has a corresponding open-circuit voltage change rate greater than that of the first cell. Optionally, $0.75 \leq CB1 \leq 1.1$.

Optionally, the discharge cell balance ratio of the second cell is CB2, $0.5 \leq CB2 \leq 1.4$, optionally, $1 \leq CB2 \leq 1.25$.

Optionally, the first cell has a nominal capacity of CAP1, and the second cell has a nominal capacity of CAP2, $CAP1/CAP2 \geq 1$, and $CB2/CB1 \geq 1$.

Optionally, $0.95 \times (CB2/CB1) \leq CAP1/CAP2 \leq 1.05 \times (CB2/CB1)$.

Optionally, M and N satisfy: $1 \leq M \leq N$, optionally, $1 \leq M \leq 15N$, during the charging of the battery unit, for an $\Delta SOC$ of a certain SOC interval, the first cell has an open-circuit voltage difference of $\Delta OCV1$, and the second cell has an open-circuit voltage difference of $\Delta OCV2$, which satisfy the following relationship: $(M \times \Delta OCV2 + N \times \Delta OCV1)/((M+N) \times \Delta SOC) > 0.005 V/\%$ SOC.

Optionally, in the SOC-OCV curve of the second cell, the rate of change $\Delta OCV2/\Delta SOC2$ of the open circuit voltage OCV2 of the second cell relative to the state of charge SOC2 of the second cell in the interval of 20% to 70% SOC satisfies: $\Delta OCV2/\Delta SOC2 \geq 0.005 V/\%$ SOC.

Optionally, the positive electrode active material of the second cell includes a lithium-containing phosphate represented by formula (I), $$LiFe_{1-x2-y2}Mn_{x2}M'_{y2}PO_4 \quad \text{formula (I)}$$ 

in the formula (I), $0 \leq x2 \leq 1$, $0 \leq y2 \leq 0.1$, and M' is selected from one or more of transition metal elements, except Fe and Mn, and non-transition metal elements.

Optionally, the positive electrode active material of the second cell also includes at least one of the layered lithium transition metal oxide represented by formula (II), and the compounds represented by formula (IV) or formula (V), $$Li_{1+x1}Ni_{a1}Co_{b1}M1_{c1}M2_{1-a1-b1-c1}O_{2-y1}Al_{y1} \quad \text{formula (II)}$$ 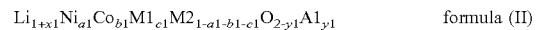

in the formula (II), $-0.1 \leq x1 \leq 0.2$, $0.3 \leq a1 \leq 0.97$, $0 < b1 \leq 0.3$, $0 < a1+b1+c1 < 1$, $0 \leq y1 < 0.2$, M1 is selected from at least one of Mn and Al, M2 is selected from one or more of Fe, Cr, Ti, Zn, V, Al, W, Mg, B, Cu, Y, Si, Sr, Zr and Ce, and Al is selected from one or more of S, N, F, Cl, Br, $PO_4^{3-}$ and I; optionally, $0.5 \leq a1 \leq 0.7$, $0.01 \leq b1 \leq 0.15$;

$$Na_{x4}M3[M'(CN)_6]_{y4} \cdot z4H_2O \quad \text{formula (IV)}$$ 

$$Na_{z3}M4_hM5_k(PO_4)_1X_{y3}/C \quad \text{formula (V)}$$ 

In the formula (IV), M3 is a transition metal, M' is a transition metal, $0 \leq x4 \leq 2$, $0.8 \leq y4 < 1$, $0 < z4 \leq 20$;

in the formula (V), M4 and M5 are each independently a transition metal ion selected from Ti, V, Cr, Mn, Fe, Co, Ni, Cu, Zn, Ga, Sr, Y, Nb, Mo, Sn, Ba and W or O; X is a halide ion selected from F, Cl and Br, wherein h, k, l and y3 are all≥0, and satisfy chemical coordination with z3.

Optionally, the positive electrode active material of the first cell includes a lithium-containing phosphate represented by formula (III),

$$LiFe_{1-x5-y5}Mn_{x5}M''_{y5}PO_4 \qquad \text{formula (III)}$$

wherein $0 \leq x5 \leq 1$, $0 \leq y5 \leq 0.1$, and M" is selected from one or more of transition metal elements, except Fe and Mn, and non-transition metal elements.

Optionally, the negative electrode active material of the first cell and the negative electrode active material of the second cell can be independently selected from one or more of synthetic graphite, natural graphite, soft carbon, hard carbon, silicon-based materials, tin-based materials, and lithium titanate;

optionally, the negative electrode active material of the first cell and the negative electrode active material of the second cell have the same composition.

In a second aspect, the present application provides a battery pack, comprising the battery unit of the first aspect.

In a third aspect, the present application provides an electrical device, comprising the battery unit of the above first aspect or the battery pack of the above second aspect, wherein the battery unit or the battery pack is used as a power supply or an energy storage unit of the power consuming device.

In a fourth aspect, the present application provides a method for manufacturing a battery unit, comprising the steps of: obtaining a first cell type and a second cell type, wherein the first cell type includes N first cells, the second cell type includes M second cells, and N and M are positive integers; the first cell has a discharge cell balance rate of CB1, the second cell has a discharge cell balance rate of CB2, with $0.5 \leq CB1 \leq CB2 \leq 1.4$, and when the battery unit is charged to 95%-100% of the state of charge, the first cell has a corresponding open-circuit voltage change rate of not greater than 0.005 V/% SOC, and the second cell type has a corresponding open-circuit voltage change rate greater than that of the first cell; and electrically connecting the first cell type and the second cell type in a manner including a series connection, so as to form the battery unit of the above first aspect.

In a fifth aspect, the present application provides an apparatus for manufacturing a battery unit, comprising: a clamping arm unit, for obtaining a first cell type and a second cell type, wherein the first cell type includes N first cells, the second cell type includes M second cells, and N and M are positive integers; the first cell has a discharge cell balance rate of CB1, the second cell has a discharge cell balance rate of CB2, with $0.5 \leq CB1 \leq CB2 \leq 1.4$, and when the battery unit is charged to 95%-100% of the state of charge, the first cell has a corresponding open-circuit voltage change rate of not greater than 0.005 V/% SOC, and the second cell type has a corresponding open-circuit voltage change rate greater than that of the first cell; an assembling unit, for electrically connecting the first cell type and the second cell type in a manner including a series connection, so as to form the battery unit of the above first aspect; and a control unit, for controlling the clamping arm unit and the assembling unit.

[Technical Effect]

In the present disclosure, at least one indicative cell is included for the indication for a working cell and for a control such that the charging of the battery unit is stopped when the BMS detects that the state of charge SOC2 value of the indicative cell reaches the specified SOC value of a high-end area during the charging of the battery unit, and the state of charge of the battery unit at this time is the state of full charge, such that the accumulated error of the ampere-hour integration method can be prevented and the overall SOC prediction accuracy of the battery unit can be improved; and by means of keeping the capacity of the high-end area (i.e., the high SOC area) from release, the working cell can be designed with a smaller discharge cell balance rate (CB value); thus, the service life (capacity) compensation can be achieved while saving the amount of negative electrode graphite, which can further improve the energy density of the battery unit.

In addition, in the present application, the anodes of the working cell and the indicative cell are designed to be similar anodes, such that the service life (capacity) compensation levels of the working cell and the indicative cell can be basically the same, and the decay rates of the working cell and the indicative cell can be basically the same, which can prevent the buckets effect of the battery unit affecting the overall capacity.

Figure 1:
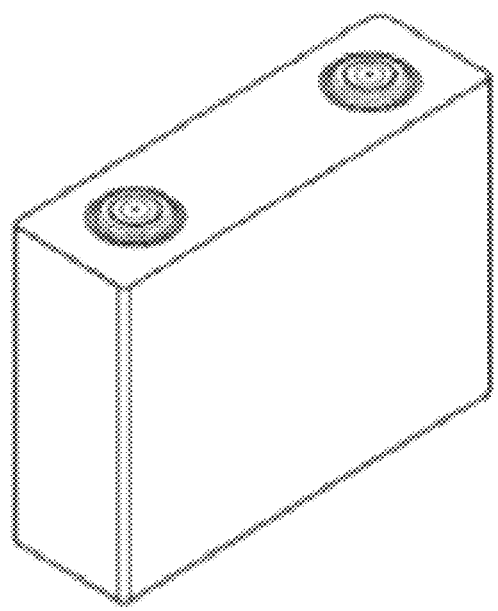
FIG. 1 is a schematic diagram showing an example of a cell of the present application.

LIST OF REFERENCE NUMERALS 5, 5a, 5b—cell
51—housing
52—electrode assembly
53—cover plate
4—battery unit
1—battery pack
2—upper case body
3—lower case body

DETAILED DESCRIPTION OF EMBODIMENTS

"Ranges" disclosed herein are defined in the form of lower and upper limits, and a given range is defined by selection of a lower limit and an upper limit, the selected lower and upper limits defining the boundaries of the particular range. Ranges defined in this manner may be inclusive or exclusive, and may be arbitrarily combined, that is, any lower limit may be combined with any upper limit to form a range. For example, if the ranges of 60-120 and 80-110 are listed for a particular parameter, it should be understood that the ranges of 60-110 and 80-120 are also contemplated. Additionally, if minimum range values 1 and 2 are listed, and maximum range values 3, 4, and 5 are listed, the following ranges are all contemplated: 1-3, 1-4, 1-5, 2-3, 2-4, and 2-5. In the present application, unless stated otherwise, the numerical range "a-b" represents an abbreviated representation of any combination of real numbers between a and b, where both a and b are real numbers. For example, the numerical range "0-5" means that all real numbers between "0-5" have been listed herein, and "0-5" is just an abbreviated representation of the combinations of these numerical values. In addition, when a parameter is expressed as an integer of ≥2, it is equivalent to disclosing that the parameter is, for example, an integer of 2, 3, 4, 5, 6, 7, 8, 9, 10, 11, 12, and the like.

In the present application, all the embodiments and preferred embodiments mentioned herein can be combined with one another to form new technical solutions, unless otherwise stated.

In the present application, all the technical features and preferred features mentioned herein can be combined with one another to form new technical solutions, unless otherwise stated.

In the present application, unless otherwise stated, all the steps mentioned herein can be performed sequentially or randomly, preferably sequentially. For example, the method including steps (a) and (b) indicates that the method may include steps (a) and (b) performed sequentially, and may also include steps (b) and (a) performed sequentially. For example, reference to "the method may further include step (c)" indicates that step (c) may be added to the method in any order, e.g., the method may include steps (a), (b) and (c), steps (a), (c) and (b), and also steps (c), (a) and (b), etc.

In the present application, the terms "comprise" and "include" mentioned herein are open-ended or closed-ended, unless otherwise stated. For example, "comprise" and "include" may mean that other components not listed may further be comprised or included, or only the listed components may be comprised or included.

In the description herein, it should be noted that, unless otherwise stated, "no less than" and "no more than" means the endpoints preceded by them being included, and "more" in the phrase "one or more" means two or more.

In the description herein, unless otherwise stated, the term "or" is inclusive. For example, the phrase "A or B" means "A, B, or both A and B." More specifically, a condition "A or B" is satisfied by any one of the following: A is true (or present) and B is false (or not present); A is false (or not present) and B is true (or present); or both A and B are true (or present).

[Cell]

In the present application, "cell" refers to a battery cell that can be independently charged and discharged. The components of the cell may include a positive electrode plate, a negative electrode plate, a separator, an electrolyte, and an outer packaging for encapsulating the positive electrode plate, negative electrode plate, separator, and electrolyte, etc. The types and shapes of the cell are not specifically limited in the present application, and the cell can be various cells, such as soft-packed cells, cylindrical cells, or square cells. The cells in the present application can be lithium ion cells, potassium ion cells, sodium ion cells, lithium sulfur cells, etc., and are particularly preferably lithium ion cells. During the charge/discharge process of the battery, active ions are intercalated and de-intercalated back and forth between the positive electrode plate and the negative electrode plate. The electrolyte is located between the positive electrode plate and the negative electrode plate and functions for conducting ions.

In the present application, the "chemical system" of the cell is classified according to the components of the positive electrode active material used in the positive electrode plate of the cell, and the elements or substances for doping or coating for the positive electrode active material are not limited. For example, a cell whose positive electrode active material is lithium iron phosphate (including those doped with an Mn or V element) can be defined as a cell of a lithium iron phosphate chemical system. The cell whose positive electrode active material is lithium nickel cobalt manganese oxide (generally referred to as NCM) can be defined as a cell of an NCM chemical system. Further, the chemical system of the cell can be further defined according to the relative contents of nickel, cobalt and manganese element in the positive electrode active material. For example, the cell whose positive electrode active material is $LiNi_{0.5}Co_{0.2}Mn_{0.3}O_2$ (generally referred to as NCM523) can be defined as a cell of an NCM523 chemical system, the cell whose positive electrode active material is $LiNi_{0.6}Co_{0.2}Mn_{0.2}O_2$ (generally referred to as NCM622) can be defined as a cell of an NCM622 chemical system, and the cell whose positive electrode active material is $LiNi_{0.8}Co_{0.1}Mn_{0.1}O_2$ (generally referred to as NCM811) can be defined as a cell of an NCM811 chemical system. A cell whose positive electrode material is a lithium nickel cobalt aluminum oxide system (generally referred to as NCA) can be defined as a cell of an NCA chemical system. In addition, in the present application, a hybrid system cell can also be used, for example, a hybrid system cell including NCM and NCA.

Next, the basic structures of the negative electrode plate, the positive electrode plate, the electrolyte, and the separator included in the cell in the present application will be described first.

<Negative Electrode Plate>

In the present application, the cell comprises a negative electrode plate comprising a negative electrode current collector and a negative electrode film layer disposed on at least one surface of the negative electrode current collector, wherein the negative electrode film layer comprises a negative electrode active material.

In one embodiment of the present application, the negative electrode active material of the negative electrode film layer may comprise common negative electrode active materials, such as one or more of natural graphite, synthetic graphite, soft carbon, hard carbon, silicon-based materials, tin-based materials and lithium titanate. The silicon-based material may be selected from one or more of elemental silicon, silicon oxides, and silicon carbon composites. The tin-based material can be selected from one or more of elemental tin, a tin oxide compound, and a tin alloy.

In the cell of the present application, the negative electrode film layer comprises the negative electrode active material and an optional binder, an optional conductive agent and other optional auxiliary agents, and is usually formed by coating a negative electrode slurry, followed by drying. The negative electrode slurry is generally formed by dispersing a negative electrode active material, and an optional conductive agent and a binder etc., into a solvent and uniformly stirring same. The solvent may be N-methylpyrrolidone (NMP) or deionized water.

As an example, the conductive agent may include one or more of superconducting carbon, carbon black (for example, acetylene black, Ketjen black), carbon dots, carbon nanotubes, graphene, and carbon nanofibers.

As an example, the binder can include one or more of a butadiene styrene rubber (SBR), a water soluble unsaturated resin SR-1B, a polyacrylic acid (PAA), sodium polyacrylate (PAAS), polyacrylamide (PAM), polyvinyl alcohol (PVA), sodium alginate (SA), and carboxymethyl chitosan (CMCS). As an example, the binder may include one or more of a butadiene styrene rubber (SBR), polyvinyl alcohol (PVA), sodium alginate (SA), polymethacrylic acid (PMAA) and carboxymethyl chitosan (CMCS). Other optional auxiliary agents are for example thickening agents (e.g., sodium carboxymethyl cellulose CMC-Na), PTC thermistor materials, etc.

In addition, in the cell of the present application, the negative electrode plate may comprise other additional functional layers in addition to the negative electrode film layer. For example, in some embodiments, the negative electrode plate of the present application may also comprise a conductive primer (e.g., composed of a conductive agent and a binder) provided between the negative electrode current collector and the first negative electrode film layer and disposed on the surface of the negative electrode current collector. In some other embodiments, the negative electrode plate of the present application may also comprise a protective cover layer covering the surface of the second negative electrode film layer.

In the cell of the present application, the negative electrode current collector may be a metal foil or a composite current collector, for example, the metal foil may be a copper foil, a silver foil, an iron foil or a foil composed of an alloy of the above metals. The composite current collector can include a polymer material substrate and a metal layer formed on at least one surface of the polymer material substrate, which can be formed by forming a metal material (copper, copper alloys, nickel, nickel alloys, titanium, titanium alloys, silver and silver alloys, etc.) on the polymer material substrate (such as a substrate made from a material such as polypropylene PP, polyethylene terephthalate PET, polybutylene terephthalate PBT, polystyrene PS, polyethylene PE and a copolymer thereof).

<Positive Electrode Plate>

In the cell of the present application, the positive electrode plate comprises a positive electrode current collector and a positive electrode film layer which is provided on at least one surface of the positive electrode current collector and comprises a positive electrode active material. For example, the positive electrode current collector has two opposite surfaces in the thickness direction thereof, and the positive electrode film layer is provided on either or both of the two opposite surfaces of the positive electrode current collector. In the cell of the present application, the positive electrode current collector may be a metal foil or a composite current collector, for example, the metal foil may be an aluminum foil, and the composite current collector may include a polymer material substrate and a metal layer formed on at least one surface of the polymer material substrate. The composite current collector can be formed by forming a metal material (aluminum, aluminum alloys, nickel, nickel alloys, titanium, titanium alloys, silver and silver alloys, etc.) on a polymer material substrate (such as polypropylene PP, polyethylene terephthalate PET, polybutylene terephthalate PBT, polystyrene PS, polyethylene PE and a copolymer thereof, etc.).

In the cell of the present application, the positive electrode active material can be a positive electrode active material known in the art for cells. For example, the positive electrode active material may include one or more of the following: lithium-containing phosphates of an olivine structure, lithium transition metal oxides and their respective modified compounds. However, the present application is not limited to these materials, and other conventional materials that can be used as positive electrode active materials for cells may also be used. These positive electrode active materials may be used alone or in combination of two or more. Among them, examples of lithium transition metal oxides may include, but are not limited to, one or more of lithium cobalt oxide (e.g. $LiCoO_2$), lithium nickel oxide (e.g. $LiNiO_2$), lithium manganese oxide (e.g. $LiMnO_2$, $LiMn_2O_4$), lithium nickel cobalt oxide, lithium manganese cobalt oxide, lithium nickel manganese oxide, lithium nickel cobalt manganese oxide (e.g. $LiNi_{1/3}Co_{1/3}Mn_{1/3}O_2$ (NCM333), $LiNi_{0.5}Co_{0.2}Mn_{0.3}O_2$ (NCM523), $LiNi_{0.5}Co_{0.25}Mn_{0.25}O_2$ (NCM211), $LiNi_{0.6}Co_{0.2}Mn_{0.2}O_2$ (NCM622), $LiNi_{0.8}Co_{0.1}Mn_{0.1}O_2$ (NCM811)), lithium nickel cobalt aluminum oxide (e.g. $LiNi_{0.85}Co_{0.15}Al_{0.05}O_2$), and modified compounds thereof, etc. Examples of lithium-containing phosphates of an olivine structure may include, but are not limited to, one or more of lithium iron phosphate (e.g., $LiFePO_4$ (LFP)), lithium iron phosphate and carbon composites, lithium manganese phosphate (e.g., $LiMnPO_4$), lithium manganese phosphate and carbon composites, lithium iron manganese phosphate, and lithium iron manganese phosphate and carbon composites.

In some embodiments, the positive electrode film layer may optionally comprise a binder. Non-limiting examples of binders that can be used in the positive electrode film layer can include one or more of the following: polyvinylidene fluoride (PVDF), polytetrafluoroethylene (PTFE), a vinylidene fluoride-tetrafluoroethylene-propylene terpolymer, a vinylidene fluoride-hexafluoropropylene-tetrafluoroethylene terpolymer, a tetrafluoroethylene-hexafluoropropylene copolymer and a fluorine-containing acrylate resin.

In some embodiments, the positive electrode film layer may also optionally comprise a conductive agent. Examples of the conductive agent for the positive electrode film layer may include one or more of superconducting carbon, acetylene black, carbon black, Ketjen black, carbon dots, carbon nanotubes, graphene and carbon nanofibers.

In one embodiment of the present application, the positive electrode can be prepared by: the above-mentioned components for preparing a positive electrode, such as a positive electrode active material, a conductive agent, a binder and any other components, are dispersed in a solvent (e.g. N-methylpyrrolidone) to form a uniform positive electrode slurry; and coating a positive electrode current collector with the positive electrode slurry, followed by the procedures such as drying and cold pressing, so as to obtain the positive electrode plate.

<Electrolyte>

The electrolyte is located between the positive electrode plate and the negative electrode plate and functions for conducting ions. The electrolyte comprises an electrolyte salt and a solvent. In some embodiments, the electrolyte salt may be selected from one or more of lithium hexafluorophosphate ($LiPF_6$), lithium tetrafluoroborate ($LiBF_4$), lithium perchlorate ($LiClO_4$), lithium hexafluoroarsenate ($LiAsF_6$), lithium bisfluorosulfonimide (LiFSI), lithium bistrifluoromethanesulfonimide (LiTFSI), lithium trifluoromethanesulfonate (LiTFS), lithium difluorooxalate borate (LiDFOB), lithium dioxalate borate (LiBOB), lithium difluorophosphate (LiPO$_2$F$_2$), lithium bisoxalatodifluorophosphate (LiDFOP) and lithium tetrafluorooxalate phosphate (LiTFOP).

In one embodiment of the present application, the solvent may be selected from one or more of: ethylene carbonate (EC), propylene carbonate (PC), ethyl methyl carbonate (EMC), diethyl carbonate (DEC), dimethyl carbonate (DMC), dipropyl carbonate (DPC), methyl propyl carbonate (MPC), ethyl propyl carbonate (EPC), butylene carbonate (BC), fluoroethylene carbonate (FEC), methyl formate (MF), methyl acetate (MA), ethyl acetate (EA), propyl acetate (PA), methyl propionate (MP), ethyl propionate (EP), propyl propionate (PP), methyl butyrate (MB), ethyl butyrate (EB), 1,4-butyrolactone (GBL), sulfolane (SF), dimethyl sulfone (MSM), ethyl methyl sulfone (EMS) and diethyl sulfone (ESE).

In one embodiment of the present application, based on the total weight of the electrolyte, the content of the solvent is 60-99 wt %, for example 65-95 wt %, or 70-90 wt %, or 75-89 wt %, or 80-85 wt %. In one embodiment of the present application, based on the total weight of the electrolyte, the content of the electrolyte is 1-40 wt %, for example 5-35 wt %, or 10-30 wt %, or 11-25 wt %, or 15-20 wt %.

In one embodiment of the present application, the electrolyte may also optionally contain an additive. For example, the additive may include one or more of: a negative electrode film-forming additive, a positive electrode film-forming additive, and can also include an additive that can improve certain performance of the battery, such as an additive to improve the overcharge performance of a battery, an additive to improve the high temperature performance of a battery, and an additive to improve the low temperature performance of a battery, etc.

<Separator>

In one embodiment of the present application, the cell further includes a separator, which separates the anode side from the cathode side of the cell, and provides selective permeation or barrier to substances of different types, sizes and charges in the system, for example, the separator can insulate electrons, physically isolate the positive and negative electrode active materials of the cell, prevent internal short circuits and form an electric field in a certain direction, and at the same time enable the ions in the battery to pass through the separator to move between the positive and negative electrodes.

In one embodiment of the present application, the material used to prepare the separator may include one or more of a glass fiber, a non-woven fabric, polyethylene, polypropylene and polyvinylidene fluoride. The separator may be a single-layer film, or a multi-layer composite film. When the separator is a multi-layer composite film, the materials of the respective layers may be the same or different.

In one embodiment of the present application, the above positive electrode plate, negative electrode plate and separator can be made into an electrode assembly/bare cell by a winding process or a lamination process.

In one embodiment of the present application, the cell may include an outer package which may be used to encapsulate the above-mentioned electrode assembly and electrolyte. In some embodiments, the outer package of the cell may be a hard shell, such as a hard plastic shell, an aluminum shell, and a steel shell. In some further embodiments, the outer package of the cell may be a soft bag, such as a pouch-type soft bag. The material of the soft bag may plastics, such as one or more of polypropylene (PP), polybutylene terephthalate (PBT), polybutylene succinate (PBS), etc.

Figure 2:
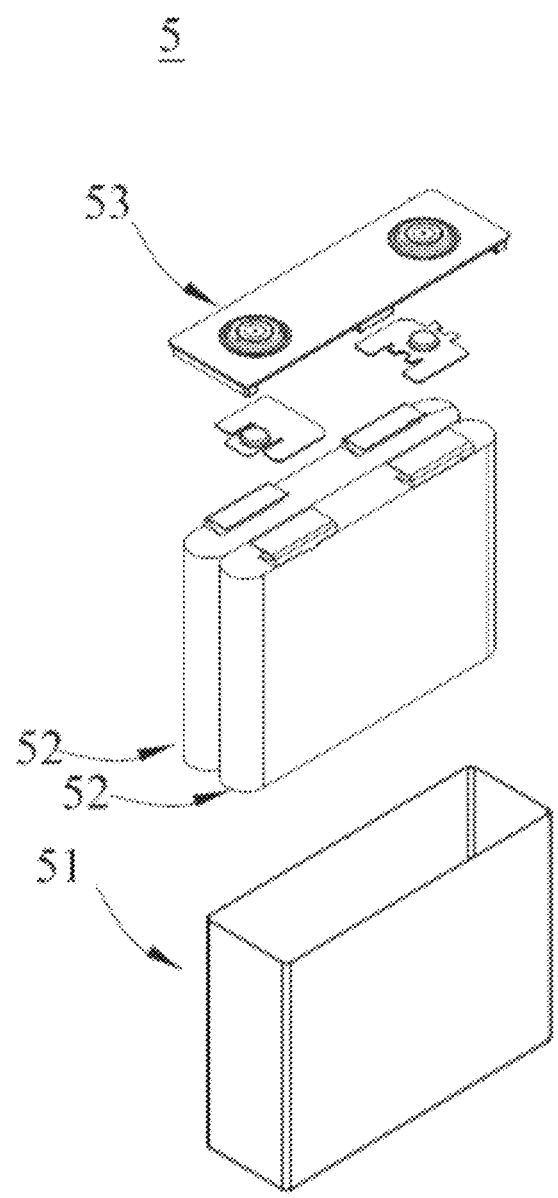
FIG. 2 is an exploded view showing an example of the cell of the present application shown in FIG. 1.

FIG. 1 is a schematic diagram showing an example of cell 5 of the present application. FIG. 2 is an exploded view showing an example of the cell 5 of the present application shown in FIG. 1.

The outer package can include a housing 51 and a cover plate 53, wherein the housing 51 may include a bottom plate and side plates connected to the bottom plate, and the bottom plate and the side plates enclose to form an accommodating cavity. The housing 51 has an opening in communication with the accommodating cavity, and the cover plate 53 can cover the opening to close the accommodating cavity. The positive electrode plate, the negative electrode plate and the separator may form an electrode assembly 52 by a winding process or a laminating process, the electrode assembly is encapsulated in the accommodating cavity and the electrolyte infiltrates the electrode assembly 52. The cell 5 can include one or more electrode assemblies 52.

[Battery Unit]

In the present application, "battery unit" is formed by electrically connecting a certain number of cells together and placing same in a frame to protect the cells from external shock, heat, vibration, etc. The cell of the present application may be of a cylindrical, square or any other shape.

In the present application, several cells may be assembled together to form a battery unit, the battery unit contains two or more cells, and the specific number of the cell depends on the application of the battery unit and the parameters of the individual battery unit.

Figure 3:
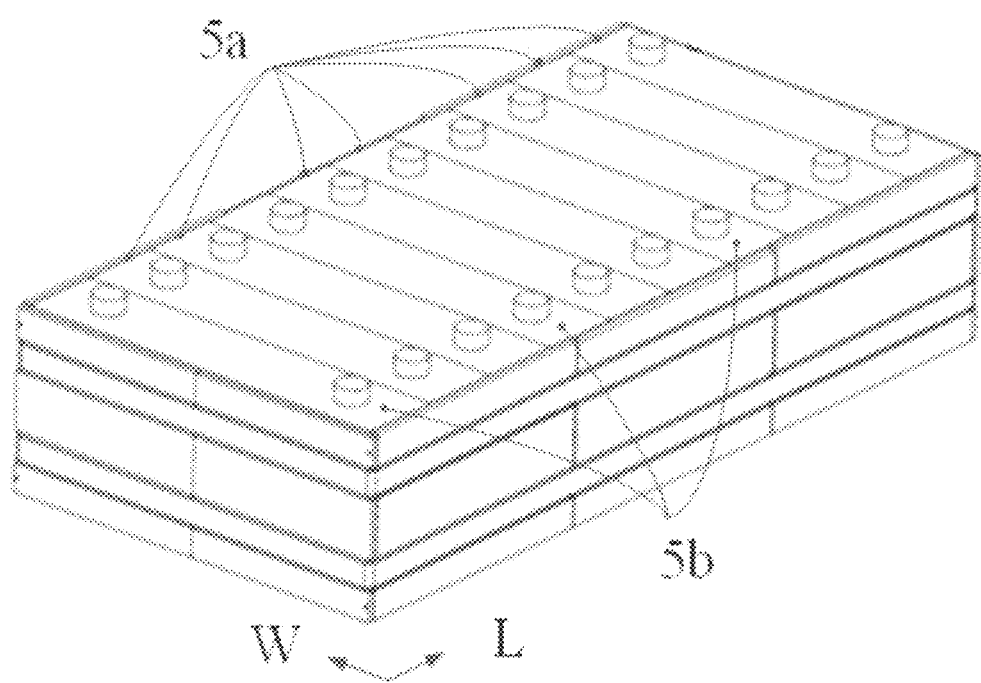
FIG. 3 is a schematic diagram showing an example of a battery unit of the present application.

FIG. 3 is a schematic diagram showing an example of a battery unit of the present application. Referring to FIG. 3, in the battery unit 4, multiple cells 5a and 5b can be successively arranged in the length of the battery unit 4 (wherein 5a can be the first cell and 5b can be the second cell). Apparently, the cells can also be disposed in any other manner. Further, the multiple cells 5a and 5b can be fixed by fasteners. Optionally, the battery unit 4 may also include a housing with an accommodating space in which multiple cells 5a and 5b are accommodated.

<Design of the First Cell Type and the Second Cell Type>

In the present application, the battery unit comprises a first cell type and a second cell type electrically connected at least in series, wherein the first cell type includes N first cells, the second cell type includes M second cells, and N and M are positive integers; the first cell has a discharge cell balance rate of CB1, the second cell has a discharge cell balance rate of CB2, with $0.5 \leq CB1 \leq CB2 \leq 1.4$, and when the battery unit is charged to 95%-100% of the state of charge, the first cell has a corresponding open-circuit voltage change rate of not greater than 0.005 V/% SOC, and the second cell type has a corresponding open-circuit voltage change rate greater than that of the first cell. Optionally, $0.75 \leq CB1 \leq 1.1$.

Herein, "SOC" represents the State Of Charge, which refers to the ratio of the remaining capacity of the cell to the rated capacity under the same conditions, for example, it can be 100%, 99%, 90%, 80%, 70%, 60%, 50%, 40%, 30%, 20%, 10% and 0%. In addition, in the present application, the first cell type involves a working cell, and the second cell type involves an indicative cell.

Figure 7:
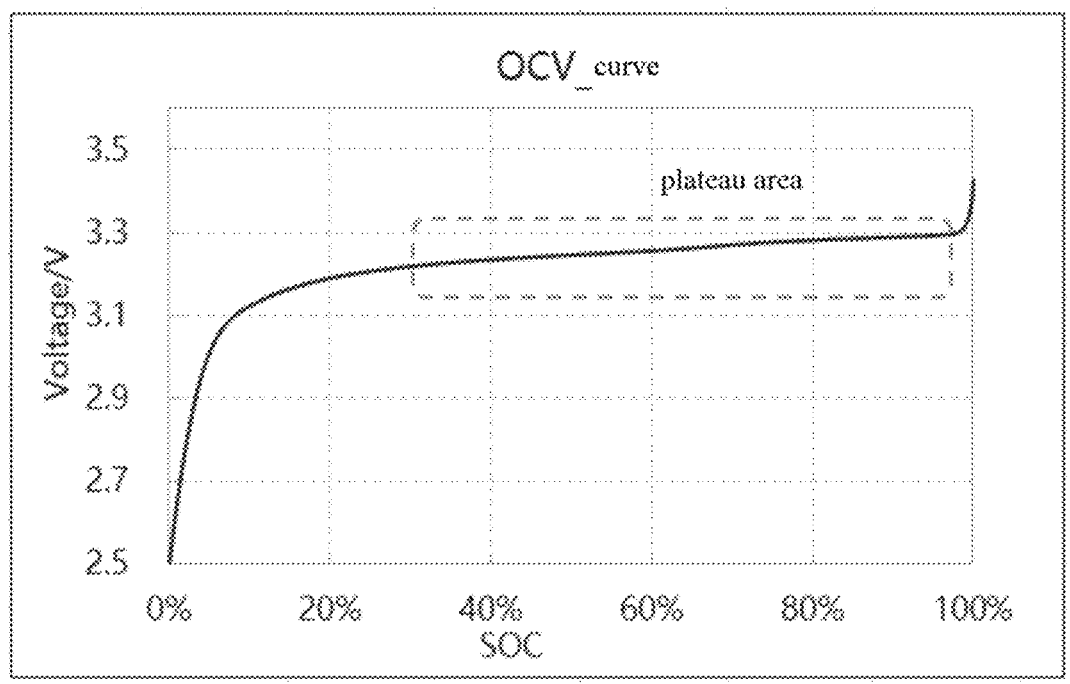
FIG. 7 is a schematic diagram showing a plateau region of an SOC-OCV curve of a working cell in the battery unit of the present application.

FIG. 7 is a schematic diagram showing a plateau region of an SOC-OCV curve of a working cell in the battery unit of the present application. In the example shown in FIG. 7, the SOC-OCV curve of the working cell has a plateau region in the interval of approximately 30% SOC-95% SOC. In this plateau region, the change rate $\Delta OCV1/\Delta SOC1$ of the open-circuit voltage OCV1 of the working cell relative to the state of charge SOC1 of the working cell is less than or equal to 0.005 V/% SOC.

Figure 8:
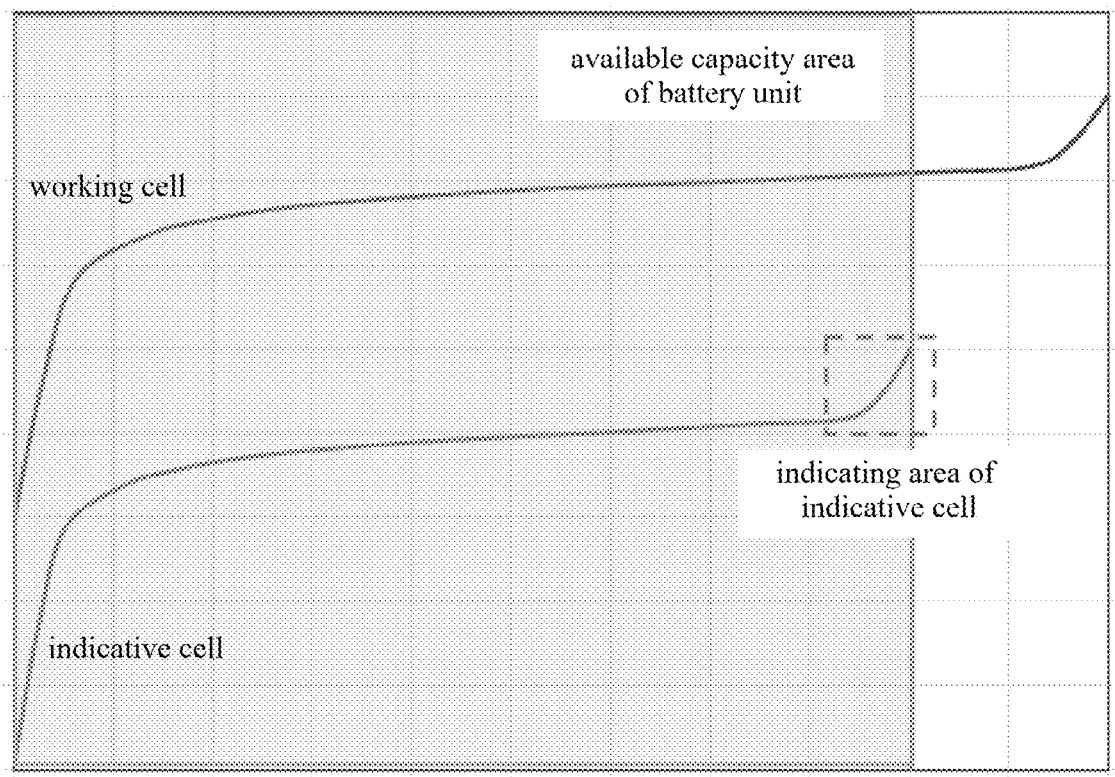
FIG. 8 is a schematic diagram showing the indication of an indicative cell for a working cell in the battery unit of the present application.

In addition, FIG. 8 is a schematic diagram showing the indication of an indicative cell for a working cell in the battery unit of the present application. As shown in FIG. 8, the charging of the battery unit is stopped when the BMS detects that the state of charge SOC2 value of the indicative cell reaches a specified SOC value (such as 100% SOC), and the state of charge of the battery unit at this time is regarded as the state of full charge. In the example shown in FIG. 8, the dotted box represents the indication area of the indicative cell, the indication area indicating stopping to charge the battery unit, the hatched section represents the effective capacity area of the battery unit obtained by stopping the charging indicated by the indicative cell, at the moment, the working cell only uses the capacity of SOC (for example, 80% of the capacity) corresponding to the indication area of the indicative cell.

(Obtaining SOC-OCV Curve)

In the present application, the method for obtaining an OCV change curve of the cell in the 0%-100% SOC range generally includes the steps of:

S101: charging the cell until same reaches the nominal upper limit cut-off voltage of the cell, such that the cell is fully charged;

S102: allowing the fully charged cell to stand for a preset time, so that the electrolyte in the cell can fully infiltrate the separator and electrode materials, such that the voltage of the cell tends to be stable;

S103: discharging the cell to the lower limit cut-off voltage of the cell with a preset discharge rate, and testing the actual discharged capacity C0 of the cell, with the actual discharged capacity C0 being the actual capacity of the cell;

S104: allowing the discharged cell to stand for a preset time, so that the electrolyte in the cells can fully infiltrate the separator and electrode materials, such that the voltage of the cell tends to be stable;

S105: repeating steps S101-S102 to fully charge the cell;

S106: discharging the cell for a time t1 with a preset discharge rate, that is, 5% of the battery capacity is released; at the moment, the remaining capacity of the battery is 95% SOC;

S107: allowing the cell, which is discharged for a time t1, to stand for a preset time, and testing the open circuit voltage OCV of the cell at the moment as the static OCV at 95% SOC; and S108: repeating steps S106-S107 to successively obtain the static OCVs corresponding to 90% SOC, 85% SOC, 0% SOC state, respectively, so as to obtain the OCV change curve in the 0%400% SOC range.

The following is an embodiment of the method for testing the OCV change curve of a cell in the 0%-100% SOC range in the present application, including the steps of:

S101: charging the cell with the nominal current at a constant current and constant voltage until it reaches the nominal upper limit cut-off voltage of the cell, such that the cell is fully charged;

S102: allowing the fully charged cell to stand for 2 hours, so that the electrolyte in the cell can fully infiltrate the separator and electrode materials, such that the voltage of the cell tends to be stable;

S103: discharging the cell to the lower limit cut-off voltage of the cell with a discharge rate of 0.33C, and testing the actual released capacity C0 of the cell, the actual released capacity C0 being the actual capacity of the cell;

S104: allowing the discharged cell to stand for 2 hours, so that the electrolyte in the cell can fully infiltrate the separator and electrode materials, so that the voltage of the cell tends to be stable;

S105: repeating steps S101-S102 to fully charge the cell;

S106: discharging the cell for 9.09 min with a 0.33 C0 discharge rate, that is, 5% of the battery capacity is released; at the moment, the remaining capacity of the battery is 95% SOC;

S107: allowing the cell, which is discharged for 9.09 min, to stand for 2 h, and testing the open circuit voltage OCV of the cell at the moment as the static OCV at 95% SOC; and S108: repeating steps S106-S107 to successively obtain the static OCVs corresponding to 90% SOC, 85% SOC, 0% SOC state, respectively, so as to obtain the OCV change curve in the 0%-100% SOC range.

The 0.33 C discharge rate mentioned in the above steps refers to the discharge rate parameter used when the time required for charging or discharging a cell with 1C capacity is 3 h; Using a discharge rate of 0.33 C0 and a discharging time of 9.09 min, the released capacity is equal to 9.09 min/180 min=0.05, that is 5% of the total capacity C0. In addition, the nominal current can be freely selected according to the capacity of the battery unit, for example: when the capacity of the battery unit is 50 Ah, the nominal current can be 50 A; for another example, when the capacity of the battery unit is 100 Ah, the nominal current can be 100 A.

(Testing Discharge Cell Balance Rate CB)

In the present application, the discharge cell balance rate of a cell has a well-known meaning in the art, and can be tested by a conventional method. As an example, the following test method can be used: the discharge capacity of the negative electrode plate per unit area and the discharge capacity of the positive electrode plate per unit area are respectively tested; then according to the formula: the discharge cell balance rate of the cell=the discharge capacity of the negative electrode plate per unit area/the discharge capacity of the positive electrode plate per unit area, so the discharge cell balance rate of the cell can be calculated.

In such a case, the discharge capacity of the positive electrode plate or the negative electrode plate has a well-known meaning in the art, and can be tested by a conventional method. As an example, the following steps can be used for testing:

(1) The sampling requirements of the electrode plate are as follows:

the cell after fully discharged is disassembled, the positive electrode plate and negative electrode plate are removed, rinsed with a DMC solution properly, and dried for use. The sampling position of the positive electrode plate is: selecting any position in the middle >15 mm from the edge. The sampling position of the negative electrode plate is: selecting the negative electrode plate that is directly opposite to the selected positive electrode plate; and the sampling area of the positive electrode plate is the same as that of the negative electrode plate;

(2) Using the positive electrode plate, negative electrode plate as cut above and a lithium piece as a counter electrode to assemble a coin half cell;

(3) Discharge capacity of the negative electrode plate per unit area:

the test voltage is 0.05-2.0 V, the test temperature is 25° C., the charge/discharge rate is 0.1 C, and no less than 10 parallel samples are taken for testing the discharge capacity of the coin half cell, respectively; removing the lowest and highest values, then the average value is taken to obtain the discharge capacity of the negative electrode plate at this area; the discharge capacity of the negative electrode plate obtained by the above test is divided by the area of the negative electrode plate to obtain the discharge capacity of the negative electrode plate per unit area; and (4) Discharge capacity of the positive electrode plate per unit area:

the positive electrode plate is charged/discharged at 0.1C within the working voltage range specified in the GBT certification document of the sampled cells and at room temperature of 25° C., no less than 10 parallel samples are taken for testing the discharge capacity of the coin battery respectively; removing the lowest and highest values, the average value is taken to obtain the discharge capacity of the positive electrode plate at this area; the discharge capacity of the positive electrode plate obtained by the above test is divided by the area of the positive electrode plate to obtain the discharge capacity of the positive electrode plate per unit area.

In the present disclosure, at least one indicative cell is included for the indication for a working cell and for a control such that the charging of the battery unit is stopped when the BMS detects that the state of charge SOC2 value of the indicative cell reaches the specified SOC value of a high-end area during the charging of the battery unit, and the state of charge of the battery unit at this time is the state of full charge, such that the accumulated error of the ampere-hour integration method can be prevented and the overall SOC prediction accuracy of the battery unit can be improved; and by means of keeping the capacity of the high-end area (i.e., the high SOC area) from release, the working cell can be designed with a smaller discharge cell balance rate (CB value); thus, the service life (capacity) compensation can be achieved while saving the amount of negative electrode graphite, which can further improve the energy density of the battery unit.

In some embodiments of the present application, the discharge cell balance ratio of the second cell is CB2, 0.5≤CB2≤1.4, optionally, 1≤CB2≤1.25. Therefore, in the present application, by means of allowing the discharge cell balance rate of the second cell to meet the above conditions, the overall energy density of the battery unit can be further improved.

In some embodiments of the present application, the nominal capacity of the first cell is CAP1, the nominal capacity of the second cell is CAP2, CAP1/CAP2≥1, and CB2/CB1≥1. Optionally, 0.95×(CB2/CB1)≤CAP1/CAP2≤1.05×(CB2/CB1). Therefore, in the present application, the anodes of the working cell and the indicative cell are designed to be similar anodes, such that the service life (capacity) compensation levels of the working cell and the indicative cell can be basically the same, and the decay rates of the working cell and the indicative cell can be basically the same, which can prevent the buckets effect of the battery unit affecting the overall capacity.

(Testing Nominal Capacity of Cell)

In the present application, the CAP value is the nominal capacity of the cell at the nominal voltage. Unless otherwise clearly stated, the 0.33C discharge capacity value of the material system within the common voltage range of the industry is used as C0; for example, for a lithium iron phosphate battery, the value is generally 2.5V-3.65V; for NCM, the value is generally 2.5V/2.8V-4.25V/4.30V/4.35V/4.4V; if the first cell and the second cell are of the same chemical system, the test voltage range of the second cell is consistent with that of the first cell; if there is no lithium precipitation phenomenon on the disassembled interface of the cell after the capacity test is completed, the data is valid; if there is lithium precipitation on the disassembled interface, the first and second cells need to be disassembled and the cathode electrode plate is cut and assembled into a half cell with a lithium piece and then the same test is performed as follows:

the test procedure of the nominal capacity CAP is as follows:

(1) Allow to stand for 2 h;
(2) Discharge to V1 (nominal cut-off voltage of a cell) at a rate of 0.33C;
(3) Allow to stand for 10 min;
(4) Charge to V2 (nominal cut-off voltage of a cell) at a rate of 0.33C, and charge at a constant voltage to a current of ≤0.05C;
(5) Allow to stand for 10 min;
(6) 0.33C DC V1 (nominal cut-off voltage of a cell); and
(7) Allow to stand for 10 min;

the discharge capacity in step 6 is the CAP of the cell; and the number is ≥12, 2 maximum values and 2 minimum values are removed and the average value is taken.

In some embodiments of the present application, M and N satisfy: 1≤M≤N, optionally, 1≤M≤15N, during the charging of the battery unit, for an ΔSOC of a certain SOC interval, the first cell has an open-circuit voltage difference of ΔOCV1, and the second cell has an open-circuit voltage difference of ΔOCV2, which satisfy the following relationship: (M×ΔOCV2+N×ΔOCV1)/((M+N)×ΔSOC) >0.005V/% SOC. Therefore, in the present application, by means of allowing the SOC-OCV curves of the first and second cells to meet the above conditions, the overall voltage control accuracy of the battery unit can be further improved.

In some embodiments of the present application, in the SOC-OCV curve of the second cell, the rate of change ΔOCV2/ΔSOC2 of the open circuit voltage OCV2 of the second cell relative to the state of charge SOC2 of the second cell in the interval of 20% to 70% SOC satisfies: ΔOCV2/ΔSOC2≥0.005V/% SOC.

In some embodiments of the present application, the positive electrode active material of the second cell includes a lithium-containing phosphate represented by formula (I),

$$\text{LiFe}_{1-x2-y2}\text{Mn}_{x2}\text{M'}_{y2}\text{PO}_4 \quad \text{formula (I)}$$

in the formula (I), 0≤x2≤1, 0≤y2≤0.1, and M' is selected from one or more of transition metal elements, except Fe and Mn, and non-transition metal elements.

In some embodiments of the present application, the positive electrode active material of the second cell also includes at least one of a layered lithium transition metal oxide represented by formula (II), and a compound represented by formula (IV) or formula (V),

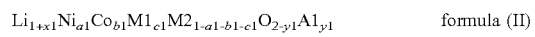

$$\text{Li}_{1+x1}\text{Ni}_{a1}\text{Co}_{b1}\text{M1}_{c1}\text{M2}_{1-a1-b1-c1}\text{O}_{2-y1}\text{Al}_{y1} \quad \text{formula (II)}$$

In the formula (II), −0.1≤x1≤0.2, 0.3≤a1<0.97, 0<b1≤0.3, 0<a1+b1+c1<1, 0≤y1<0.2, M1 is selected from at least one of Mn and Al, M2 is selected from one or more of Fe, Cr, Ti, Zn, V, Al, W, Mg, B, Cu, Y, Si, Sr, Zr and Ce, and Al is selected from one or more of S, N, F, Cl, Br, $PO_4^{3-}$ and I; optionally, 0.5≤a1≤0.7, 0.01≤b1≤0.15;

$$\text{Na}_{x4}\text{M3}[\text{M'(CN)}_6]_{y4}\cdot z4\text{H}_2\text{O} \quad \text{formula (IV)}$$

$$\text{Na}_{z3}\text{M4}_h\text{M5}_k(\text{PO}_4)_1\text{X}_{y3}/\text{C} \quad \text{formula (V)}$$

In the formula (IV), M3 is a transition metal, M' is a transition metal, 0<x4≤2, 0.8≤y4<1, 0<z4≤20;

in the formula (V), M4 and M5 are each independently a transition metal ion selected from Ti, V, Cr, Mn, Fe, Co, Ni, Cu, Zn, Ga, Sr, Y, Nb, Mo, Sn, Ba and W or O; X is a halide ion selected from F, Cl and Br, wherein h, k, l and y3 are all≥0, and satisfy chemical coordination with z3.

Figure 9:
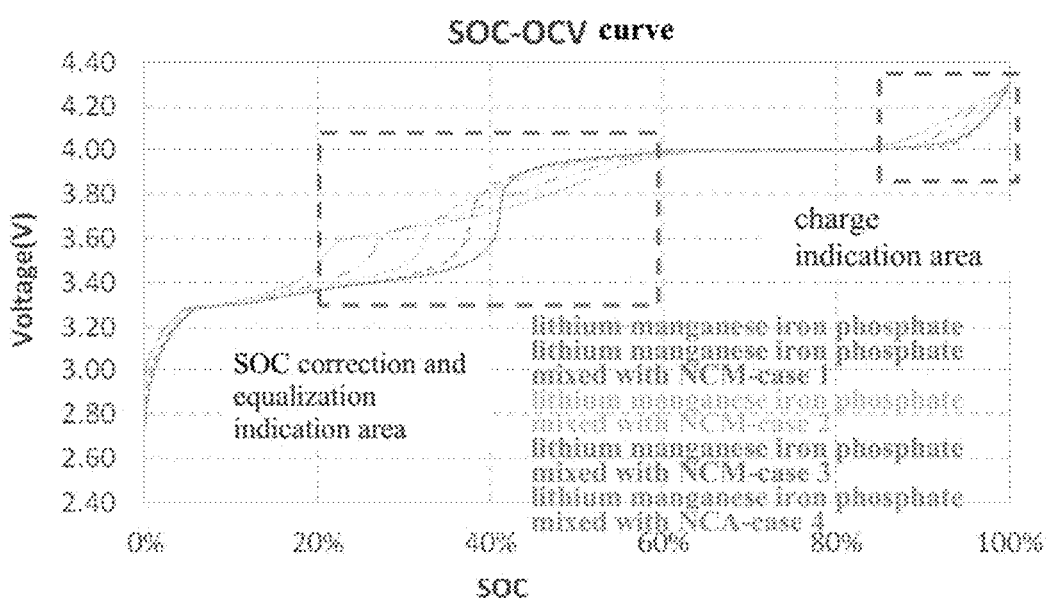
FIG. 9 is a schematic diagram showing an SOC-OCV curve of an indicative cell in the battery unit of the present application.

FIG. 9 is a schematic diagram showing an SOC-OCV curve of an indicative cell in the battery unit of the present application. In FIG. 9, the solid line represents the SOC-OCV curve of the indicative cell whose positive electrode material is lithium manganese iron phosphate, and the dash line represents the SOC-OCV curve of the indicative cell of mixed case 1 in which the positive electrode material is lithium manganese iron phosphate mixed with NCM; the one-dot dash line represents the SOC-OCV curve of the indicative cell of the mixed case 2 in which the positive electrode material is lithium manganese iron phosphate mixed with NCM, and the double-dot dash line represents the SOC-OCV curve of the indicative cell of the mixed case 3 in which the positive electrode material is lithium manganese iron phosphate mixed with NCM, the dot line represents the SOC-OCV curve of the indicative cell of the mixed case 4 in which the positive electrode material is lithium manganese iron phosphate mixed with NCA. The above five SOC-OCV curves for indicative cells all include an SOC correction and equalization indicating area and a charging indicating area (i.e., the indicating area of the indicative cell in FIG. 8).

(Description of SOC Correction)

Usually, during the car driving, cumulative discharge capacity is calculated according to the discharge current and the sampling time. However, due to the sampling error of the current sampler, there is a relatively large cumulative error in the SOC prediction after a certain period of accumulation. The SOC needs to be corrected according to the static voltage data of the cell (generally the OCV sampling data, after having allowed to stand for >10 min). Usually, the static SOC-OCV of the cell system can be maintained at a relatively high consistency as the cell ages, but the voltage change in the plateau area is small, and the calibration effect of SOC is weakened. By changing the difference in OCV change, the functional utilization of SOC correction can be improved.

(Description of Equilibrium Indication Area)

The equilibrium indication area refers to the change of the initial SOC-OCV curve by a mixed system; since the lithium iron phosphate and lithium manganese iron phosphate materials have a large plateau area (the voltage change is extremely small), it is difficult to obtain the change of SOC, and it is difficult to distinguish the difference between the self-discharge and SOC state of different cells, so it is difficult to identify the need for equalization of cells in this working condition. Therefore, enabling a larger OCV change can be beneficial to identify the inconsistency of the cells, facilitate the equalization indication requirements, adjust the 0% SOC or 100% SOC alignment of each cell, and prevent the overall total capacity from being deteriorated by the buckets effect at the high and low ends resulting from the inconsistency of the cells.

In some embodiments of the present application, the positive electrode active material of the first cell includes a lithium-containing phosphate represented by formula (III),

$$LiFe_{1-x5-y5}Mn_{x5}M''_{y5}PO_4 \qquad \text{formula (III)}$$

wherein $0 \leq x5 \leq 1$, $0 \leq y5 \leq 0.1$, and M" is selected from one or more of transition metal elements, except Fe and Mn, and non-transition metal elements.

In some embodiments of the present application, the negative electrode active material of the first cell and the negative electrode active material of the second cell can be independently selected from one or more of synthetic graphite, natural graphite, soft carbon, hard carbon, silicon-based materials, tin-based materials, and lithium titanate;

optionally, the negative electrode active material of the first cell and the negative electrode active material of the second cell have the same composition.

Therefore, in the present application, the negative electrode active materials of the working cell and the indicative cell are designed to have the same composition, such that the service life (capacity) compensation levels of the working cell and the indicative cell can be basically the same, and the decay rates of the working cell and the indicative cell can be basically the same, which can prevent the buckets effect of the battery unit affecting the overall capacity.

In addition, in the present application, the indicative cell can achieve a long life by a lithium-replenishing technology, wherein, the lithium-replenishing technology can be: pre-lithiation of cathode and anode active materials; or use of different lithium compensating agents for compensation, such as cathode lithium compensating agents, anode lithium compensating agents, electrolyte lithium compensating agents; or technologies such as directly pressing a lithium foil or lithium tape onto the anode surface.

In the battery unit of the present application, the first cell type and the second cell type are electrically connected, so as to output electrical energy externally with a required voltage and current or store electrical energy. In such a case, the first cell type and the second cell type may be electrically connected in series or in a series/parallel combination. In the present application, when the first cell type and the second cell type are electrically connected at least in series, the first cell type and the second cell type can be charged/discharged synchronously, which facilitates the realization of the consistent capacity decay characteristics of cells of different types in the battery unit, which is conducive to achieving a relatively long cycle life of the battery unit. In one specific example, the first cell type and the second cell type are electrically connected in series.

In some embodiments of the present application, the electrical connection manner of the first cell type and the second cell type further includes parallel connection. In the present application, the parallel connection of the first cell type and the second cell type may be that a plurality of first-type cells and the second-type cells are connected in series to form a sub-module, and then on this basis, two or more sub-modules of the same total voltage are connected in parallel. This can further improve the external output current of the battery unit.

[Manufacturing Method]

Another aspect of the present application provides a method for manufacturing a battery unit, comprising the following steps: obtaining a first cell type and a second cell type, wherein the first cell type includes N first cells, the second cell type includes M second cells, and N and M are positive integers; the first cell has a discharge cell balance rate of CB1, the second cell has a discharge cell balance rate of CB2, with $0.5 \leq CB1 \leq CB2 \leq 1.4$, and when the battery unit is charged to 95%-100% of the state of charge, the first cell has a corresponding open-circuit voltage change rate of not greater than 0.005 V/% SOC, and the second cell type has a corresponding open-circuit voltage change rate greater than that of the first cell; and electrically connecting the first cell type and the second cell type in a manner including a series connection, so as to form the above battery unit.

In the battery unit manufactured by the manufacturing method of the present application, at least one indicative cell is included for the indication for a working cell and for a control such that the charging of the battery unit is stopped when the BMS detects that the state of charge SOC2 value of the indicative cell reaches the specified SOC value of a high-end area during the charging of the battery unit, and the state of charge of the battery unit at this time is the state of full charge, such that the accumulated error of the ampere-hour integration method can be prevented and the overall SOC prediction accuracy of the battery unit can be improved; and by means of keeping the capacity of the high-end area (i.e., the high SOC area) from release, the working cell can be designed with a smaller discharge cell balance rate (CB value); thus, the service life (capacity) compensation can be achieved while saving the amount of negative electrode graphite, which can further improve the energy density of the battery unit.

The technical features of the battery unit in the present application are also applicable to the manufacturing method of the battery unit, and produce the corresponding beneficial effects.

Both the first cell type and the second cell type can be obtained commercially or prepared by methods known in the art. As an example, a positive electrode plate, a separator and a negative electrode plate can be formed into a battery cell by a stacking process or a winding process; The battery cell is placed into an outer packaging, an electrolyte is injected, following by subsequent procedures such as packaging to obtain the battery cell.

The positive electrode plate can be prepared according to conventional methods in the art. For example, a positive electrode active material, a conductive agent and a binder are dispersed in a solvent to form a uniform positive electrode slurry, wherein the solvent is e.g., N-methylpyrrolidone (NMP); the positive electrode slurry is coated onto a positive electrode current collector, and is then subjected to procedures such as drying and cold pressing, so as to obtain the positive electrode plate.

The negative electrode plate can be prepared according to conventional methods in the art. For example, a negative electrode active material, a conductive agent, a binder and a thickener are dispersed in a solvent to form a uniform negative electrode slurry, wherein the solvent is e.g., deionized water; the negative electrode slurry is coated onto a negative electrode current collector, and is then subjected to procedures such as drying and cold pressing, so as to obtain the negative electrode plate.

[Manufacturing Apparatus]

In another aspect, the present application provides a manufacturing apparatus for a battery unit, comprising: a clamping arm unit, for obtaining a first cell type and a second cell type, wherein the first cell type includes N first cells, the second cell type includes M second cells, and N and M are positive integers; the first cell has a discharge cell balance rate of CB1, the second cell has a discharge cell balance rate of CB2, with $0.5 \leq CB1 \leq CB2 \leq 1.4$, and when the battery unit is charged to 95%-100% of the state of charge, the first cell has a corresponding open-circuit voltage change rate of not greater than 0.005 V/% SOC, and the second cell type has a corresponding open-circuit voltage change rate greater than that of the first cell; an assembling unit, for electrically connecting the first cell type and the second cell type in a manner including a series connection, so as to form the above battery unit; and a control unit, for controlling the clamping arm unit and the assembling unit.

[Battery Pack]

In a further aspect, the present application also provides a battery pack, comprising any one or several battery units of the present application. The number of battery units contained in the battery pack can be adjusted according to the application and capacity of the battery pack. Optionally, the battery pack may further include auxiliary components such as a battery management system module (BMS) and cooling/heating components.

In some embodiments, the battery pack includes two or more battery units, each battery unit being a battery unit as described herein. The battery pack has a relatively high safety, and at the same time, the capacity decay trend of the cells of different chemical systems is basically the same, so the cycle life thereof can be significantly improved.

Figure 4:
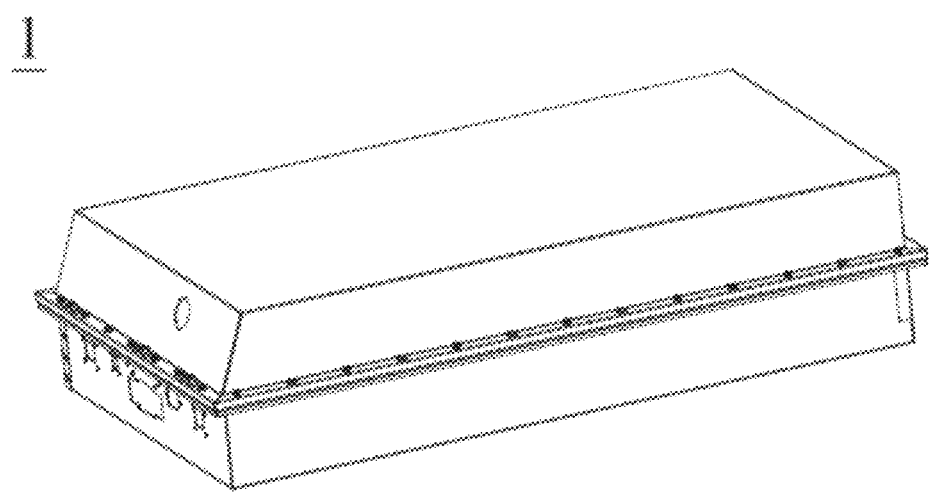
FIG. 4 is a schematic diagram showing an example of a battery pack of the present application.
Figure 5:
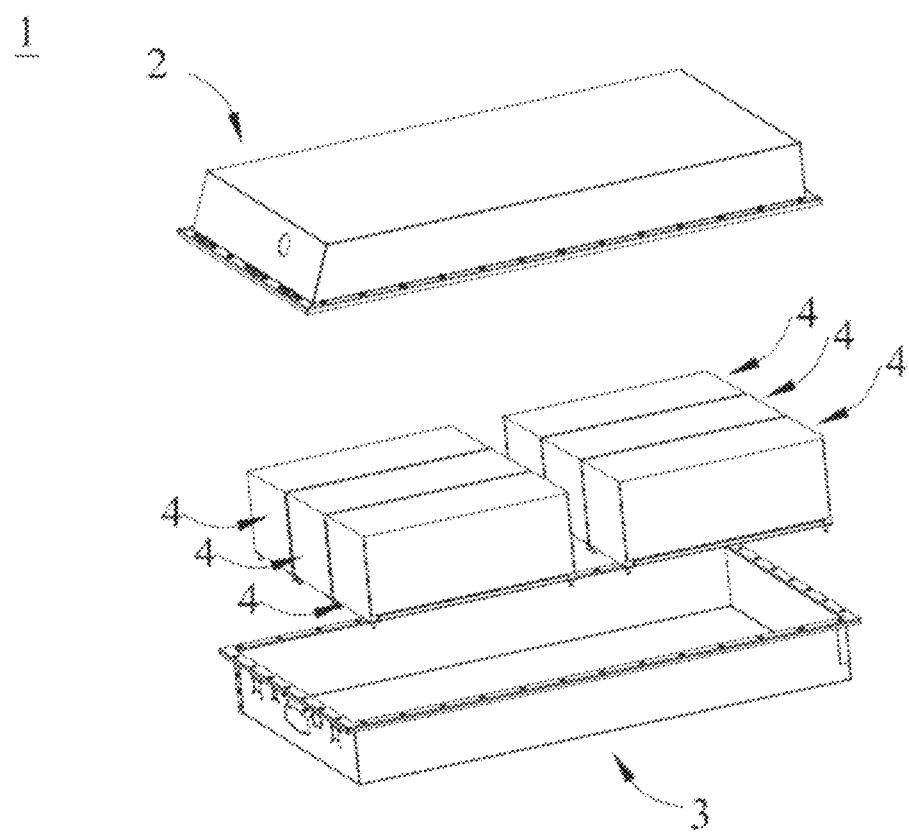
FIG. 5 is an exploded view showing an example of the battery pack of the present application shown in FIG. 4.

FIG. 4 and FIG. 5 show a battery pack 1 as an example. Referring to FIG. 4 and FIG. 5, the battery pack 1 may comprise a battery case and a plurality of battery units 4 arranged in the battery box. The battery case comprises an upper box body 2 and a lower case body 3, wherein the upper case body 2 can cover the lower case body 3 to form a closed space for accommodating the battery units 4. The plurality of battery units 4 may be arranged in the battery box in any manner.

[Power Consuming Device]

In another aspect, the present application further provides a power consuming device comprising the battery unit or battery pack described in the present application. The battery unit or battery pack can be used as a power source for a power consuming device for providing power to the power consuming device; or can also be used as an energy storage unit for the power consuming device. The power consuming device may be, but is not limited to, a mobile device (e.g., a mobile phone, a laptop computer, etc.), an electric vehicle (e.g., a pure electric vehicle, a hybrid electric vehicle, a plug-in hybrid electric vehicle, an electric bicycle, an electric scooter, an electric golf cart, an electric truck, etc.), an electric train, ship and satellite, an energy storage system, etc. The electrochemical device for the power consuming device may be selected according to its usage requirements, such as a battery unit or battery pack.

Figure 6:
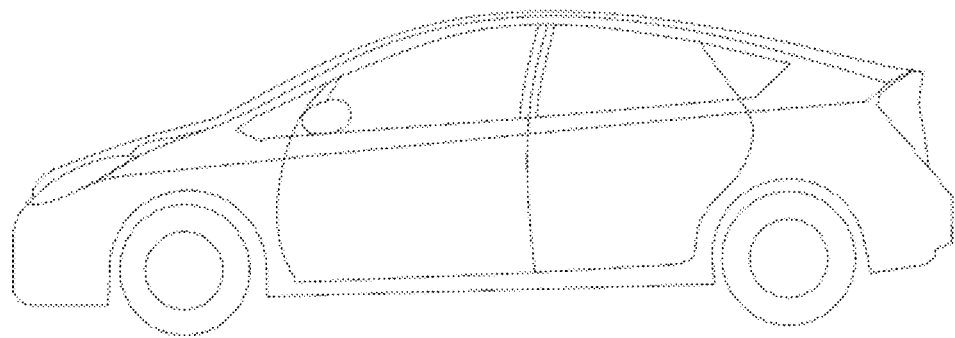
FIG. 6 is a schematic diagram showing an example of an electrical device using the battery unit of the present application as a power source.

FIG. 6 shows a power consuming device as an example. The power consuming device may be a pure electric vehicle, a hybrid electric vehicle, a plug-in hybrid electric vehicle or the like. The power consuming device can be operated with a battery pack or a battery module.

[Control Method of Battery Unit]

In another aspect, the present application further provides a method for controlling a battery unit, comprising a first cell type and a second cell type electrically connected at least in series, wherein the first cell type includes N first cells, the second cell type includes M second cells, and N and M are positive integers; the first cell has a discharge cell balance rate of CB1, the second cell has a discharge cell balance rate of CB2, with $0.5 \leq CB1 \leq CB2 \leq 1.4$, and when the battery unit is charged to 95%-100% of the state of charge, the first cell has a corresponding open-circuit voltage change rate of not greater than 0.005 V/% SOC, and the second cell type has a corresponding open-circuit voltage change rate greater than that of the first cell.

EXAMPLES

Hereinafter, the technical solutions and advantages thereof in the present application will be described in detail by means of specific embodiments.

"Cell Preparation"

Referring to GB/T 31484-2015 "Cycle life requirements and test methods for traction battery of electric vehicle", the preparation methods for the cells in various embodiments and comparative example are as follows.

1. Preparation of Positive Electrode Slurry

A positive electrode material, conductive carbon Super P, and a binder of polyvinylidene fluoride (PVDF) are fully stirred and mixed in an appropriate amount of N-methylpyrrolidone (abbreviated as NMP) solvent at a weight ratio of 95:3:2 to form a uniform and stable slurry with a viscosity of 10000 mPa·s, with no gelling, delaminate or settling within 24 hours of having been allowed to stand.

2. Preparation of Positive Electrode Plate the positive electrode material slurry is uniformly coated onto an Al foil of a positive electrode current collector, and after drying, the electrode plate is cold-pressed to a design compaction, and slitted for use to obtain a positive electrode plate.

3. Preparation of Electrolyte an equal volume of ethylene carbonate is dissolved in propylene carbonate, and then lithium hexafluorophosphate is uniformly dissolved in the mixed solvent (with a concentration of lithium hexafluorophosphate of electrolyte 1.0 M/L) for use to obtain an.

4. Preparation of Negative Electrode Plate a negative active material such as graphite and conductive carbon, a binder of a polystyrene butadiene copolymer (SBR), a thickener of sodium carboxymethyl cellulose (CMC) are fully stirred and mixed at a weight ratio of 95:2:2:1 in an appropriate amount of a water solvent to form a uniform stable negative electrode slurry; the slurry is uniformly coated onto a Cu foil of a negative electrode current collector, and after drying, the electrode plate is cold-pressed to a design compaction, and is slitted for use.

5. Separator

PE is used as a separator.

6. Preparation of Cell a conventional cell manufacturing process is used, a positive electrode plate, a separator and a negative electrode plate are wound together to form a bare cell, which is then placed into a battery housing, an electrolyte is injected, followed by formation, sealing and other processes, and finally a rechargeable power cell is obtained.

"Assembly of Battery Unit"

In the battery unit, the first cell type and the second cell type are electrically connected in series. As an example, the first cell type includes 4 first cells, and the second cell type includes 1 second cell.

"Test Methods for Cells and Battery Units"

1. Obtaining the SOC-OCV Curve

In the present application, the method for obtaining an OCV change curve of the cell in the 0%-100% SOC range generally includes the steps of:

S101: charging the cell until same reaches the nominal upper limit cut-off voltage of the cell, such that the cell is fully charged;

S102: allowing the fully charged cell to stand for a preset time, so that the electrolyte in the cell can fully infiltrate the separator and electrode materials, such that the voltage of the cell tends to be stable;

S103: discharging the cell to the lower limit cut-off voltage of the cell with a preset discharge rate, and testing the actual discharged capacity C0 of the cell, with the actual discharged capacity C0 being the actual capacity of the cell;

S104: allowing the discharged cell to stand for a preset time, so that the electrolyte in the cells can fully infiltrate the separator and electrode materials, such that the voltage of the cell tends to be stable;

S105: repeating steps S101-S102 to fully charge the cell;

S106: discharging the cell for a time t1 with a preset discharge rate, that is, 5% of the battery capacity is released; at the moment, the remaining capacity of the battery is 95% SOC;

S107: allowing the cell, which is discharged for a time t1, to stand for a preset time, and testing the open circuit voltage OCV of the cell at the moment as the static OCV at 95% SOC; and S108: repeating steps S106-S107 to successively obtain the static OCVs corresponding to 90% SOC, 85% SOC, 0% SOC state, respectively, so as to obtain the OCV change curve in the 0%-100% SOC range.

The following is an embodiment of the method for testing the OCV change curve of a cell in the 0%-100% SOC range in the present application, including the steps of:

S101: charging the cell with the nominal current at a constant current and constant voltage until it reaches the nominal upper limit cut-off voltage of the cell, such that the cell is fully charged;

S102: allowing the fully charged cell to stand for 2 hours, so that the electrolyte in the cell can fully infiltrate the separator and electrode materials, such that the voltage of the cell tends to be stable;

S103: discharging the cell to the lower limit cut-off voltage of the cell with a discharge rate of 0.33C, and testing the actual released capacity C0 of the cell, the actual released capacity C0 being the actual capacity of the cell;

S104: allowing the discharged cell to stand for 2 hours, so that the electrolyte in the cell can fully infiltrate the separator and electrode materials, so that the voltage of the cell tends to be stable;

S105: repeating steps S101-S102 to fully charge the cell;

S106: discharging the cell for 9.09 min with a 0.33 C0 discharge rate, that is, 5% of the battery capacity is released; at the moment, the remaining capacity of the battery is 95% SOC;

S107: allowing the cell, which is discharged for 9.09 min, to stand for 2 h, and testing the open circuit voltage OCV of the cell at the moment as the static OCV at 95% SOC; and S108: repeating steps S106-S107 to successively obtain the static OCVs corresponding to 90% SOC, 85% SOC, 0% SOC state, respectively, so as to obtain the OCV change curve in the 0%-100% SOC range.

The 0.33 C discharge rate mentioned in the above steps refers to the discharge rate parameter used when the time required for charging or discharging a cell with 1C capacity is 3 h; Using a discharge rate of 0.33 C0 and a discharging time of 9.09 min, the released capacity is equal to 9.09 min/180 min=0.05, that is 5% of the total capacity C0. In addition, the nominal current can be freely selected according to the capacity of the battery unit, for example: when the capacity of the battery unit is 50 Ah, the nominal current can be 50 A; for another example, when the capacity of the battery unit is 100 Ah, the nominal current can be 100 A.

2. Testing Discharge Cell Balance Rate CB

In the present application, the discharge cell balance rate of a cell has a well-known meaning in the art, and can be tested by a conventional method. As an example, the following test method can be used: the discharge capacity of the negative electrode plate per unit area and the discharge capacity of the positive electrode plate per unit area are respectively tested; then according to the formula: the discharge cell balance rate of the cell=the discharge capacity of the negative electrode plate per unit area/the discharge capacity of the positive electrode plate per unit area, so the discharge cell balance rate of the cell can be calculated.

In such a case, the discharge capacity of the positive electrode plate or the negative electrode plate has a well-known meaning in the art, and can be tested by a conventional method. As an example, the following steps can be used for testing:

(1) The sampling requirements of the electrode plate are as follows:

the cell after fully discharged is disassembled, the positive electrode plate and negative electrode plate are removed, rinsed with a DMC solution properly, and dried for use. The sampling position of the positive electrode plate is: selecting any position in the middle >15 mm from the edge. The sampling position of the negative electrode plate is: selecting the negative electrode plate that is directly opposite to the selected positive electrode plate; and the sampling area of the positive electrode plate is the same as that of the negative electrode plate;

(2) Using the positive electrode plate, negative electrode plate as cut above and a lithium piece as a counter electrode to assemble a coin half cell;

(3) Discharge capacity of the negative electrode plate per unit area:

the test voltage is 0.05-2.0 V, the test temperature is 25° C., the charge/discharge rate is 0.1 C, and no less than 10 parallel samples are taken for testing the discharge capacity of the coin half cell, respectively; removing the lowest and highest values, then the average value is taken to obtain the discharge capacity of the negative electrode plate at this area; the discharge capacity of the negative electrode plate obtained by the above test is divided by the area of the negative electrode plate to obtain the discharge capacity of the negative electrode plate per unit area; and (4) Discharge capacity of the positive electrode plate per unit area:

the positive electrode plate is charged/discharged at 0.1C within the working voltage range specified in the GBT certification document of the sampled cells and at room temperature of 25° C., no less than 10 parallel samples are taken for testing the discharge capacity of the coin battery respectively; removing the lowest and highest values, the average value is taken to obtain the discharge capacity of the positive electrode plate at this area; the discharge capacity of the positive electrode plate obtained by the above test is divided by the area of the positive electrode plate to obtain the discharge capacity of the positive electrode plate per unit area.

3. Testing Nominal Capacity of a Cell

In the present application, the CAP value is the nominal capacity of the cell at the nominal voltage. Unless otherwise clearly stated, the 0.33C discharge capacity value of the material system within the common voltage range of the industry is used as C0; for example, for a lithium iron phosphate battery, the value is generally 2.5V-3.65V; for NCM, the value is generally 2.5V/2.8V-4.25V/4.30V/4.35V/4.4V; if the first cell and the second cell are of the same chemical system, the test voltage range of the second cell is consistent with that of the first cell.

the test procedure of the nominal capacity CAP is as follows:

(1) Allow to stand for 2 h;
(2) Discharge to V1 (nominal cut-off voltage of a cell) at a rate of 0.33C;
(3) Allow to stand for 10 min;
(4) Charge to V2 (nominal cut-off voltage of a cell) at a rate of 0.33C, and charge at a constant voltage to a current of ≤0.05C;
(5) Allow to stand for 10 min;
(6) 0.33C DC V1 (nominal cut-off voltage of a cell); and
(7) Allow to stand for 10 min;

the discharge capacity in step 6 is the CAP of the cell; and the number is ≥12, 2 maximum values and 2 minimum values are removed and the average value is taken.

4. Volumetric Energy Density of Battery Units and Volumetric Energy Density of Cells (VED)

The volumetric energy density of a battery unit is the sum of the energies of all cells in the battery unit divided by the total volume of the battery unit (length×width×height), wherein the total volume of the battery unit includes the volumes of all cells and the volumes of other constituent parts (including, but not limited to, harnesses, end and/or side panels, and top cover plate) in the battery unit. The volumetric energy density of a cell is the energy of the cell divided by the volume of the cell.

5. Mass Energy Density of Battery Unit and Mass Energy Density of Cell (GED)

The mass energy density of a battery unit is the sum of the energies of all cells in the battery unit divided by the total mass of the battery unit, wherein the total mass of the battery unit includes the masses of all cells and the masses of other constituent parts (including, but not limited to, harnesses, end and/or side panels, and roof panels) in the battery unit. The mass energy density of a cell is the energy of the cell divided by the mass of the cell.

6. Service Life (Capacity) Compensation Percentage

The service life (capacity) compensation percentage indicates the ratio of the compensated capacity (such as lithium compensation) in the cell to the initial capacity. For example, the service life (capacity) compensation percentage of 100% means that the compensated capacity in the cell reaches a level the same as the initial capacity, which is not preferable from the viewpoint of production costs.

"Design of the CB1 Value of the First Cell Type"

By means of the above-mentioned "Cell Preparation" method, the following battery units of examples 1 to 11 and the battery unit of comparative example 1 can be obtained. In examples 1 to 11 and comparative example 1, the positive electrode materials of the first cell type and the second cell type are lithium iron phosphate, and the negative electrode materials of the first cell type and the second cell type are graphite. In the battery units of examples 1 to 11 and the battery unit of comparative example 1, the CB1 values of the first cell type are different from each other.

In addition, the following tables 1 to 3 showing the results of comparison between examples 1 to 11 and comparative example 1 can be obtained by the above-described test method.

TABLE 1

| | First cell type | | | | | |
|---|---|---|---|---|---|---|
| No. | Positive electrode material | Negative electrode material | CB1 | VED Wh/L | GED Wh/ kg | Cell capacity (CAP1)/ Ah |
| Example 1 | Lithium iron phosphate | Graphite | 0.50 | 530 | 220 | 258.5 |
| Example 2 | Lithium iron phosphate | Graphite | 0.75 | 485 | 206 | 235.7 |
| Example 3 | Lithium iron phosphate | Graphite | 0.90 | 459 | 199 | 222.7 |
| Example 4 | Lithium iron phosphate | Graphite | 1.00 | 442 | 195 | 214.8 |
| Example 5 | Lithium iron phosphate | Graphite | 1.05 | 437 | 193 | 212.3 |
| Example 6 | Lithium iron phosphate | Graphite | 1.10 | 426 | 190 | 207.0 |

TABLE 1-continued

| | First cell type | | | | | |
|---|---|---|---|---|---|---|
| No. | Positive electrode material | Negative electrode material | CB1 | VED Wh/L | GED Wh/kg | Cell capacity (CAP1)/Ah |
| Example 7 | Lithium iron phosphate | Graphite | 1.15 | 421 | 188.4 | 204.5 |
| Example 8 | Lithium iron phosphate | Graphite | 1.20 | 403 | 183.6 | 195.7 |
| Example 9 | Lithium iron phosphate | Graphite | 1.25 | 386.9 | 179.2 | 186.8 |
| Example 10 | Lithium iron phosphate | Graphite | 1.30 | 370 | 176.2 | 179.0 |
| Example 11 | Lithium iron phosphate | Graphite | 1.40 | 345.6 | 175.2 | 165.0 |
| Comparative example 1 | Lithium iron phosphate | Graphite | 0.45 | 551.2 | 226.6 | 274.0 |

TABLE 2

| | Second cell type | | | | | | Ratio | |
|---|---|---|---|---|---|---|---|---|
| No. | Positive electrode material | Negative electrode material | CB2 | VED Wh/L | GED Wh/kg | Cell capacity (CAP2)/Ah | CAP1/ CAP2 | CB2/ CB1 |
| Example 1 | Lithium iron phosphate | Graphite | 1.10 | 426 | 190 | 207.0 | 125% | 220% |
| Example 2 | Lithium iron phosphate | Graphite | 1.10 | 426 | 190 | 207.0 | 114% | 147% |
| Example 3 | Lithium iron phosphate | Graphite | 1.10 | 426 | 190 | 207.0 | 108% | 122% |
| Example 4 | Lithium iron phosphate | Graphite | 1.10 | 426 | 190 | 207.0 | 104% | 110% |
| Example 5 | Lithium iron phosphate | Graphite | 1.10 | 426 | 190 | 207.0 | 103% | 105% |
| Example 6 | Lithium iron phosphate | Graphite | 1.10 | 426 | 190 | 207.0 | 100% | 100% |
| Example 7 | Lithium iron phosphate | Graphite | 1.10 | 426 | 190 | 207.0 | 99% | 96% |
| Example 8 | Lithium iron phosphate | Graphite | 1.10 | 426 | 190 | 207.0 | 95% | 92% |
| Example 9 | Lithium iron phosphate | Graphite | 1.10 | 426 | 190 | 207.0 | 90% | 88% |
| Example 10 | Lithium iron phosphate | Graphite | 1.10 | 426 | 190 | 207.0 | 86% | 85% |
| Example 11 | Lithium iron phosphate | Graphite | 1.10 | 426 | 190 | 207.0 | 80% | 79% |
| Comparative example 1 | Lithium iron phosphate | Graphite | 1.10 | 426 | 190 | 207.0 | 132% | 244% |

TABLE 3

| | Combine into Battery unit | | | | Energy density of Battery unit | | Service life (capacity) compensation percentage | |
|---|---|---|---|---|---|---|---|---|
| No. | Number of first type cells | First cell type available capacity | Number of second type cells | Second cell type available capacity | VED Wh/L | GED Wh/kg | First- type | Second- type |
| Example 1 | 4 | 129.3 | 1 | 129.3 | 265 | 112 | 100% | 60% |
| Example 2 | 4 | 176.8 | 1 | 176.8 | 364 | 156 | 33% | 17% |

TABLE 3-continued

| | Combine into Battery unit | | | | Energy density of Battery unit | | Service life (capacity) compensation percentage | |
|---|---|---|---|---|---|---|---|---|
| No. | Number of first type cells | First cell type available capacity | Number of second type cells | Second cell type available capacity | VED Wh/L | GED Wh/kg | First-type | Second-type |
| Example 3 | 4 | 200.4 | 1 | 200.4 | 413 | 180 | 11% | 3% |
| Example 4 | 4 | 207.0 | 1 | 207.0 | 426 | 188 | 4% | 0% |
| Example 5 | 4 | 197.1 | 1 | 197.1 | 406 | 180 | 8% | 5% |
| Example 6 | 4 | 188.2 | 1 | 188.2 | 387 | 173 | 10% | 10% |
| Example 7 | 4 | 180.0 | 1 | 180.0 | 371 | 166 | 14% | 15% |
| Example 8 | 4 | 172.5 | 1 | 172.5 | 355 | 161 | 13% | 20% |
| Example 9 | 4 | 165.6 | 1 | 165.6 | 343 | 157 | 13% | 25% |
| Example 10 | 4 | 159.2 | 1 | 159.2 | 329 | 155 | 12% | 30% |
| Example 11 | 4 | 147.9 | 1 | 147.9 | 309 | 153 | 12% | 40% |
| Comparative example 1 | 4 | 123.3 | 1 | 123.3 | 249 | 104 | 122% | 68% |

According to the above Tables 1 to 3, it can be seen that in comparative example 1, since the discharge cell balance rate (CB1 value) of the first cell type is 0.45, which is not within the range of $0.5 \leq CB1 \leq 1.4$, the service life (capacity) compensation percentages of the first cell type and the second cell type are too large (122% and 68%, respectively), and the energy density of the battery unit is reduced.

On the other hand, in examples 1 to 11 of the present application, by making the discharge cell balance rate (CB1 value) of the first cell type in the range of $0.5 \leq CB1 \leq 1.4$, a certain service life (capacity) compensation can be achieved, without a too large service life (capacity) compensation percentage, and the energy density of the battery unit can be improved while improving the overall SOC prediction accuracy of the battery unit.

In addition, in the present application, examples 3 to 9 are more preferred, and especially examples 3 to 6 are more preferred, which can achieve a certain service life (capacity) compensation and a higher energy density of a battery unit while improving the overall SOC prediction accuracy of the battery unit.

<Design of CB2 Value of Second Cell Type>

By means of the above-mentioned "Cell Preparation" method, the following battery units of examples 12 to 22 and the battery unit of comparative example 2 can be obtained. In examples 12 to 22 and comparative example 2, the positive electrode materials of the first cell type and the second cell type are lithium iron phosphate, and the negative electrode materials of the first cell type and the second cell type are graphite. In the battery units of examples 12 to 22 and the battery unit of comparative example 2, the CB2 values of the second cell type are different from each other.

In addition, the following tables 4 to 6 showing the results of comparison between examples 12 to 22 and comparative example 2 can be obtained by the above-described test method.

TABLE 4

| | First cell type | | | | | |
|---|---|---|---|---|---|---|
| No. | Positive electrode material | Negative electrode material | CB1 | VED Wh/L | GED Wh/kg | Cell capacity (CAP1)/Ah |
| Example 12 | Lithium iron phosphate | Graphite | 1.00 | 442 | 195 | 214.8 |
| Example 13 | Lithium iron phosphate | Graphite | 1.00 | 442 | 195 | 214.8 |
| Example 14 | Lithium iron phosphate | Graphite | 1.00 | 442 | 195 | 214.8 |
| Example 15 | Lithium iron phosphate | Graphite | 1.00 | 442 | 195 | 214.8 |
| Example 16 | Lithium iron phosphate | Graphite | 1.00 | 442 | 195 | 214.8 |
| Example 17 | Lithium iron phosphate | Graphite | 1.00 | 442 | 195 | 214.8 |
| Example 18 | Lithium iron phosphate | Graphite | 1.00 | 442 | 195 | 214.8 |
| Example 19 | Lithium iron phosphate | Graphite | 1.00 | 442 | 195 | 214.8 |
| Example 20 | Lithium iron phosphate | Graphite | 1.00 | 442 | 195 | 214.8 |
| Example 21 | Lithium iron phosphate | Graphite | 1.00 | 442 | 195 | 214.8 |
| Example 22 | Lithium iron phosphate | Graphite | 1.00 | 442 | 195 | 214.8 |
| Comparative example 2 | Lithium iron phosphate | Graphite | 1.00 | 442 | 195 | 214.8 |

TABLE 5

| | Second cell type | | | | | |
|---|---|---|---|---|---|---|
| No. | Positive electrode material | Negative electrode material | CB2 | VED Wh/L | GED Wh/kg | Cell capacity (CAP2)/Ah |
| Example 12 | Lithium iron phosphate | Graphite | 0.50 | 530 | 220 | 258.5 |
| Example 13 | Lithium iron phosphate | Graphite | 0.75 | 485 | 206 | 235.7 |

TABLE 5-continued

| | Second cell type | | | | | |
|---|---|---|---|---|---|---|
| No. | Positive electrode material | Negative electrode material | CB2 | VED Wh/L | GED Wh/kg | Cell capacity (CAP2)/ Ah |
| Example 14 | Lithium iron phosphate | Graphite | 0.90 | 459 | 199 | 222.7 |
| Example 15 | Lithium iron phosphate | Graphite | 1.00 | 442 | 195 | 214.8 |
| Example 16 | Lithium iron phosphate | Graphite | 1.05 | 437 | 193 | 212.3 |
| Example 17 | Lithium iron phosphate | Graphite | 1.10 | 426 | 190 | 207.0 |
| Example 18 | Lithium iron phosphate | Graphite | 1.15 | 421 | 188.4 | 204.5 |
| Example 19 | Lithium iron phosphate | Graphite | 1.20 | 403 | 183.6 | 195.7 |
| Example 20 | Lithium iron phosphate | Graphite | 1.25 | 386.9 | 179.2 | 186.8 |
| Example 21 | Lithium iron phosphate | Graphite | 1.30 | 370 | 176.2 | 179.0 |
| Example 22 | Lithium iron phosphate | Graphite | 1.40 | 345.6 | 175.2 | 165.0 |
| Comparative example 2 | Lithium iron phosphate | Graphite | 0.45 | 551.2 | 226.6 | 271.4 |

TABLE 6

| | Combine into Battery unit | | | | | | Energy density of Battery unit | | Service life (capacity) compensation percentage | |
|---|---|---|---|---|---|---|---|---|---|---|
| No. | Number of first type cells | First cell type available capacity | Number of second type cells | Second cell type available capacity | CAP1/ CAP2 | CB2/ CB1 | VED Wh/L | GED Wh/kg | First-type | Second-type |
| Example 12 | 4 | 129.3 | 1 | 129.3 | 83% | 50% | 266 | 116 | 66% | 100% |
| Example 13 | 4 | 176.8 | 1 | 176.8 | 91% | 75% | 364 | 159 | 22% | 33% |
| Example 14 | 4 | 200.4 | 1 | 200.4 | 96% | 90% | 413 | 181 | 7% | 11% |
| Example 15 | 4 | 210.5 | 1 | 210.5 | 100% | 100% | 433 | 191 | 2% | 2% |
| Example 16 | 4 | 210.5 | 1 | 210.5 | 101% | 105% | 433 | 191 | 2% | 1% |
| Example 17 | 4 | 207.0 | 1 | 207.0 | 104% | 110% | 426 | 188 | 4% | 0% |
| Example 18 | 4 | 204.5 | 1 | 204.5 | 105% | 115% | 421 | 186 | 5% | 5% |
| Example 19 | 4 | 195.7 | 1 | 195.7 | 110% | 120% | 403 | 179 | 10% | 10% |
| Example 20 | 4 | 186.8 | 1 | 186.8 | 115% | 125% | 385 | 172 | 15% | 15% |
| Example 21 | 4 | 179.0 | 1 | 179.0 | 120% | 130% | 369 | 165 | 20% | 20% |
| Example 22 | 4 | 165.0 | 1 | 165.0 | 130% | 140% | 341 | 155 | 30% | 30% |
| Comparative example 2 | 4 | 122.1 | 1 | 122.1 | 79% | 45% | 251 | 109 | 76% | 122% |

According to the above Tables 4 to 6, it can be seen that in comparative example 2, since the discharge cell balance rate (CB2 value) of the second cell type is 0.45, which is not within the range of 0.5≤CB2≤1.4, the service life (capacity) compensation percentages of the first cell type and the second cell type are too large (76% and 122%, respectively), and the energy density of the battery unit is reduced.

On the other hand, in examples 12 to 22 of the present application, by making the discharge cell balance rate (CB2 value) of the second cell type in the range of 0.5≤CB2≤1.4, a certain service life (capacity) compensation can be achieved, without a too large service life (capacity) compensation percentage, and the energy density of the battery unit can be improved while improving the overall SOC prediction accuracy of the battery unit.

In addition, in the present application, examples 15 to 20 are more preferred, which can achieve a certain service life (capacity) compensation and a higher energy density of a battery unit while improving the overall SOC prediction accuracy of the battery unit.

<Ratio of the CAP1 of the First Cell Type to the CAP2 of the Second Cell Type, Ratio of the CB2 of the Second Cell Type to the CB1 of the First Cell Type, and Design of the Positive Electrode Material of the Second Cell Type>

By means of the above-mentioned "Cell Preparation" method, the following battery units of examples 23 to 46 can be obtained. In examples 23 to 37, the positive electrode materials of the first cell type and the second cell type are lithium iron phosphate, and the negative electrode materials of the first cell type and the second cell type are graphite.

In example 38, the positive electrode material of the first cell type is lithium iron phosphate, the negative electrode material of the first cell type is graphite, the positive electrode material of the second cell type is NCM, and the negative electrode material of the second cell type is graphite.

In examples 39 to 41, the positive electrode material of the first cell type is lithium iron phosphate, the negative electrode material of the first cell type is graphite, the positive electrode material of the second cell type is sodium battery, and the negative electrode material of the second cell type is hard carbon.

In example 42, the positive electrode material of the first cell type is lithium iron phosphate, the negative electrode material of the first cell type is graphite, the positive electrode material of the second cell type is lithium manganese iron phosphate, and the negative electrode material of the second cell type is graphite.

In examples 43 to 45, the positive electrode material of the first cell type is lithium iron phosphate, the negative electrode material of the first cell type is graphite, the positive electrode material of the second cell type is lithium manganese iron phosphate mixed with NCM, and the negative electrode material of the second cell type is graphite.

In example 46, the positive electrode material of the first cell type is lithium iron phosphate, the negative electrode material of the first cell type is graphite, the positive electrode material of the second cell type is lithium manganese iron phosphate mixed with NCA, and the negative electrode material of the second cell type is graphite.

In addition, in examples 26 to 46, the ratio of CAP1 of the first cell type to CAP2 of the second cell type, and the ratio of CB2 of the second cell type to CB1 of the first cell type satisfy CAP1/CAP2≥1 and CB2/CB1≥1.

In addition, the following tables 7 to 9 showing the results of comparison between examples 23 to 46 can be obtained by the above-described test method.

TABLE 7

First cell type

| No. | Positive electrode material | Negative electrode material | CB1 | VED Wh/L | GED Wh/kg | Cell capacity (CAP1)/Ah |
|---|---|---|---|---|---|---|
| Example 23 | Lithium iron phosphate | Graphite | 1.00 | 442 | 195 | 214.8 |
| Example 24 | Lithium iron phosphate | Graphite | 1.00 | 442 | 195 | 214.8 |
| Example 25 | Lithium iron phosphate | Graphite | 1.00 | 442 | 195 | 214.8 |
| Example 26 | Lithium iron phosphate | Graphite | 1.00 | 442 | 195 | 214.8 |
| Example 27 | Lithium iron phosphate | Graphite | 1.00 | 442 | 195 | 214.8 |
| Example 28 | Lithium iron phosphate | Graphite | 1.00 | 442 | 195 | 214.8 |
| Example 29 | Lithium iron phosphate | Graphite | 1.00 | 442 | 195 | 214.8 |
| Example 30 | Lithium iron phosphate | Graphite | 1.00 | 442 | 195 | 214.8 |
| Example 31 | Lithium iron phosphate | Graphite | 1.00 | 442 | 195 | 214.8 |
| Example 32 | Lithium iron phosphate | Graphite | 1.00 | 442 | 195 | 214.8 |
| Example 33 | Lithium iron phosphate | Graphite | 1.00 | 442 | 195 | 214.8 |
| Example 34 | Lithium iron phosphate | Graphite | 1.00 | 442 | 195 | 214.8 |
| Example 35 | Lithium iron phosphate | Graphite | 1.00 | 442 | 195 | 214.8 |
| Example 36 | Lithium iron phosphate | Graphite | 1.00 | 442 | 195 | 214.8 |
| Example 37 | Lithium iron phosphate | Graphite | 1.00 | 442 | 195 | 214.8 |
| Example 38 | Lithium iron phosphate | Graphite | 1.00 | 442 | 195 | 214.8 |
| Example 39 | Lithium iron phosphate | Graphite | 1.00 | 442 | 195 | 214.8 |
| Example 40 | Lithium iron phosphate | Graphite | 1.00 | 442 | 195 | 214.8 |
| Example 41 | Lithium iron phosphate | Graphite | 1.00 | 442 | 195 | 214.8 |
| Example 42 | Lithium iron phosphate | Graphite | 1.00 | 442 | 195 | 214.8 |
| Example 43 | Lithium iron phosphate | Graphite | 1.00 | 442 | 195 | 214.8 |
| Example 44 | Lithium iron phosphate | Graphite | 1.00 | 442 | 195 | 214.8 |
| Example 45 | Lithium iron phosphate | Graphite | 1.00 | 442 | 195 | 214.8 |
| Example 46 | Lithium iron phosphate | Graphite | 1.00 | 442 | 195 | 214.8 |

TABLE 8

Second cell type

| No. | Positive electrode material | Negative electrode material | CB2 | VED Wh/L | GED Wh/kg | Cell capacity (CAP2)/Ah |
|---|---|---|---|---|---|---|
| Example 23 | Lithium iron phosphate | Graphite | 0.50 | 530 | 220 | 258.5 |
| Example 24 | Lithium iron phosphate | Graphite | 0.75 | 485 | 206 | 235.7 |
| Example 25 | Lithium iron phosphate | Graphite | 0.90 | 459 | 199 | 222.7 |
| Example 26 | Lithium iron phosphate | Graphite | 1.00 | 442 | 195 | 214.8 |
| Example 27 | Lithium iron phosphate | Graphite | 1.05 | 437 | 193 | 212.3 |
| Example 28 | Lithium iron phosphate | Graphite | 1.10 | 426 | 190 | 207.0 |
| Example 29 | Lithium iron phosphate | Graphite | 1.15 | 421 | 188.4 | 204.5 |
| Example 30 | Lithium iron phosphate | Graphite | 1.05 | 421.3 | 189.7 | 204.5 |
| Example 31 | Lithium iron phosphate | Graphite | 1.20 | 403 | 183.6 | 195.7 |
| Example 32 | Lithium iron phosphate | Graphite | 1.10 | 403.3 | 186.5 | 195.7 |
| Example 33 | Lithium iron phosphate | Graphite | 1.25 | 386.9 | 179.2 | 186.8 |
| Example 34 | Lithium iron phosphate | Graphite | 1.15 | 385.4 | 182.3 | 186.8 |
| Example 35 | Lithium iron phosphate | Graphite | 1.30 | 370 | 176.2 | 179.0 |
| Example 36 | Lithium iron phosphate | Graphite | 1.20 | 369.5 | 179.2 | 179.0 |
| Example 37 | Lithium iron phosphate | Graphite | 1.40 | 345.6 | 175.2 | 165.0 |
| Example 38 | NCM | Graphite | 1.25 | 560 | 229.8 | 171.84 |
| Example 39 | Sodium battery 1 | Hard carbon | 1.25 | 253.175 | 102.6 | 171.84 |
| Example 40 | Sodium battery 2 | Hard carbon | 1.25 | 352.56 | 113.7 | 171.84 |
| Example 41 | Sodium battery 3 | Hard carbon | 1.25 | 289.94 | 115.3 | 171.84 |
| Example 42 | Lithium manganese iron phosphate | Graphite | 1.10 | 403.3 | 186.50 | 195.7 |
| Example 43 | Lithium manganese iron phosphate mixed with NCM1 | Graphite | 1.10 | 423.5 | 195.8 | 195.7 |
| Example 44 | Lithium manganese iron phosphate mixed with NCM2 | Graphite | 1.10 | 440.4 | 203.7 | 195.7 |
| Example 45 | Lithium manganese iron phosphate mixed with NCM3 | Graphite | 1.10 | 453.6 | 209.8 | 195.7 |
| Example 46 | Lithium manganese iron phosphate mixed with NCA4 | Graphite | 1.10 | 462.7 | 214.0 | 195.7 |

TABLE 9

| | Combine into Battery unit | | | | | | Energy density of Battery unit | | Service life compensation percentage | |
|---|---|---|---|---|---|---|---|---|---|---|
| No. | Number of first-type cells | First-type cell available capacity | Number of second-type cells | Second-type cell available capacity | CAP1/CAP2 | CB2/CB1 | VED Wh/L | GED Wh/kg | First-type | Second-type |
| Example 23 | 4 | 129.3 | 1 | 129.3 | 83% | 50% | 265.8 | 115.9 | 66% | 100% |
| Example 24 | 4 | 176.8 | 1 | 176.8 | 91% | 75% | 363.8 | 159.3 | 22% | 33% |
| Example 25 | 4 | 200.4 | 1 | 200.4 | 96% | 90% | 412.6 | 181.4 | 7% | 11% |
| Example 26 | 4 | 210.5 | 1 | 210.5 | 100% | 100% | 433.2 | 191.1 | 2% | 2% |
| Example 27 | 4 | 210.5 | 1 | 210.5 | 101% | 105% | 433.2 | 191.2 | 2% | 1% |
| Example 28 | 4 | 207.0 | 1 | 207.0 | 104% | 110% | 426.0 | 188.3 | 4% | 0% |
| Example 29 | 4 | 204.5 | 1 | 204.5 | 105% | 115% | 420.8 | 186.2 | 5% | 15% |
| Example 30 | 4 | 204.5 | 1 | 204.5 | 105% | 105% | 420.9 | 186.5 | 5% | 5% |
| Example 31 | 4 | 195.7 | 1 | 195.7 | 110% | 120% | 402.8 | 178.8 | 10% | 20% |
| Example 32 | 4 | 195.7 | 1 | 195.7 | 110% | 110% | 402.8 | 179.4 | 10% | 10% |
| Example 33 | 4 | 186.8 | 1 | 186.8 | 115% | 125% | 384.9 | 171.5 | 15% | 25% |
| Example 34 | 4 | 186.8 | 1 | 186.8 | 115% | 115% | 384.6 | 172.1 | 15% | 15% |
| Example 35 | 4 | 179.0 | 1 | 179.0 | 120% | 130% | 368.7 | 165.2 | 20% | 30% |
| Example 36 | 4 | 179.0 | 1 | 179.0 | 120% | 120% | 368.6 | 165.8 | 20% | 20% |
| Example 37 | 4 | 165.0 | 1 | 165.0 | 130% | 140% | 340.7 | 154.9 | 30% | 40% |
| Example 38 | 4 | 171.8 | 1 | 171.8 | 125% | 125% | 394.9 | 170.8 | 25% | 25% |
| Example 39 | 4 | 171.8 | 1 | 171.8 | 125% | 125% | 333.5 | 145.3 | 25% | 25% |
| Example 40 | 4 | 171.8 | 1 | 171.8 | 125% | 125% | 353.4 | 147.5 | 25% | 25% |
| Example 41 | 4 | 171.8 | 1 | 171.8 | 125% | 125% | 340.9 | 147.9 | 25% | 25% |
| Example 42 | 4 | 195.7 | 1 | 195.7 | 110% | 110% | 402.8 | 179.4 | 10% | 10% |
| Example 43 | 4 | 195.7 | 1 | 195.7 | 110% | 110% | 406.9 | 181.3 | 10% | 10% |
| Example 44 | 4 | 195.7 | 1 | 195.7 | 110% | 110% | 410.2 | 182.9 | 10% | 10% |
| Example 45 | 4 | 195.7 | 1 | 195.7 | 110% | 110% | 412.9 | 184.1 | 10% | 10% |
| Example 46 | 4 | 195.7 | 1 | 195.7 | 110% | 110% | 414.7 | 184.9 | 10% | 10% |

According to the above tables 7 to 9, it can be seen that in examples 26 to 46 of the present application, by means of making the ratio of CAP1 of the first cell type to CAP2 of the second cell type, and the ratio of CB2 of the second cell type to CB1 of the first cell type satisfy the condition of CAP1/CAP2≥1 and CB2/CB1≥1, the anodes of the first cell type (working cells) and the second cell type (indicative cells) can be designed to be similar anodes, the service life (capacity) compensation levels of the working cell and the indicative cell can be basically the same, and the decay rate of the working cell and the indicative cell can be basically the same, which can prevent the buckets effect of the battery unit which affects the overall capacity.

In addition, in the present application, examples 29 to 36 are more preferred, which can achieve a certain service life (capacity) compensation and a higher energy density of a battery unit while improving the overall SOC prediction accuracy of the battery unit.

In addition, in examples 38 to 46 of the present application, the positive electrode material of the second cell type is not lithium iron phosphate, but other materials such as NCM, a sodium battery, lithium manganese iron phosphate, lithium manganese iron phosphate mixed with NCM, and lithium manganese iron phosphate mixed with NCA, a certain service life (capacity) compensation can be achieved, without a too large service life (capacity) compensation percentage, and the energy density of the battery unit can be improved while improving the overall SOC prediction accuracy of the battery unit.

The various examples or embodiments in the description are described in a progressive manner, each embodiment focuses on the differences from other embodiments, and the same and similar parts of the various embodiments can be referred to each other.

In the description, the explanation with reference to the terms such as "an embodiment", "some embodiments", "exemplary embodiments", "examples", "specific examples", or "some examples" means that specific features, structures, materials, or characteristics described in combination with the embodiment(s) or example(s) are included in at least one embodiment or example of the present application. In the description, the illustrative expressions of the above-mentioned terms are not necessarily referring to the same embodiment or example. Moreover, the specific features, structures, materials, or characteristics described herein may be combined in any one or more embodiments or examples in a suitable manner.

Finally, it should be noted that the above embodiments are merely used for illustrating rather than limiting the technical solution of the present application. Although the present application has been illustrated in detail with reference to the foregoing embodiments, it should be understood by those of ordinary skill in the art that the technical solutions recorded in the foregoing embodiments may still be modified, or some or all of the technical features thereof may be equivalently substituted; and while these modifications or substitutions do not make the essence of the corresponding technical solution depart from the scope of the technical solutions of the embodiments of the present application.

The invention claimed is:

1. A battery unit, comprising a first cell type and a second cell type electrically connected at least in series, wherein
the first cell type includes N first cells,
the second cell type includes M second cells, and N and M are positive integers;
the first cell has a discharge cell balance rate of CB1, the second cell has a discharge cell balance rate of CB2, with $0.5 \leq CB1 \leq CB2 \leq 1.4$, and
when the battery unit is charged to 95%-100% of the state of charge, the first cell has a corresponding open-circuit voltage change rate of not greater than 0.005 V/% SOC, and the second cell type has a corresponding open-circuit voltage change rate greater than that of the first cell.

2. The battery unit of claim 1, wherein
$0.75 \leq CB1 \leq 1.1$.

3. The battery unit of claim 1, wherein
the discharge cell balance ratio of the second cell is CB2, with $0.5 \leq CB2 \leq 1.4$.

4. The battery unit of claim 1, wherein
the first cell has a nominal capacity of CAP1, and the second cell has a nominal capacity of CAP2, $CAP1/CAP2 \geq 1$, and $CB2/CB1 \geq 1$.

5. The battery unit of claim 4, wherein $0.95 \times (CB2/CB1) \leq CAP1/CAP2 \leq 1.05 \times (CB2/CB1)$.

6. The battery unit of claim 1, wherein
M and N satisfy: $1 \leq M \leq N$,
during the charging of the battery unit, for an $\Delta SOC$ of a certain SOC interval, the first cell has an open-circuit voltage difference of $\Delta OCV1$, and the second cell has an open-circuit voltage difference of $\Delta OCV2$, which satisfy the following relationship:

$(M \times \Delta OCV2 + N \times \Delta OCV1)/((M+N) \times \Delta SOC) > 0.005 V/\% SOC$.

7. The battery unit of claim 1, wherein
in an SOC-OCV curve of the second cell, the rate of change $\Delta OCV2/\Delta SOC2$ of the open circuit voltage OCV2 of the second cell relative to the state of charge SOC2 of the second cell in the interval of 20% to 70% SOC satisfies: $\Delta OCV2/\Delta SOC2 \geq 0.005 V/\% SOC$.

8. The battery unit of claim 1, wherein
a positive electrode active material of the second cell comprises a lithium-containing phosphate represented by formula (I), $$LiFe_{1-x2-y2}Mn_{x2}M'_{y2}PO_4 \qquad \text{formula (I)}$$

in the formula (I), $0 \leq x2 \leq 1$, $0 \leq y2 \leq 0.1$, and M' is selected from one or more of transition metal elements, except Fe and Mn, and non-transition metal elements.

9. The battery unit of claim 8, wherein
the positive electrode active material of the second cell also comprises at least one of a layered lithium transition metal oxide represented by formula (II), and a compound represented by formula (IV) or formula (V), $$Li_{1+x1}Ni_{a1}Co_{b1}M1_{c1}M2_{1-a1-b1-c1}O_{2-y1}A1_{y1} \qquad \text{formula (II)}$$

in the formula (II), $-0.1 \leq x1 \leq 0.2$, $0.3 \leq a1 < 0.97$, $0 < b1 \leq 0.3$, $0 < a1+b1+c1 < 1$, $0 \leq y1 < 0.2$, M1 is selected from at least one of Mn and Al, M2 is selected from one or more of Fe, Cr, Ti, Zn, V, Al, W, Mg, B, Cu, Y, Si, Sr, Zr and Ce, and Al is selected from one or more of S, N, F, Cl, Br, $PO_4^{3-}$ and I;

$$Na_{x4}M3[M'(CN)_6]_{y4} \cdot z4H_2O \qquad \text{formula (IV)}$$

$$Na_{z3}M4_hM5_k(PO_4)_1X_{y3}/C \qquad \text{formula (V)}$$

In the formula (IV), M3 is a transition metal, M' is a transition metal, $0 < x4 \leq 2$, $0.8 \leq y4 < 1$, $0 < z4 \leq 20$;
in the formula (V), M4 and M5 are each independently a transition metal ion selected from Ti, V, Cr, Mn, Fe, Co, Ni, Cu, Zn, Ga, Sr, Y, Nb, Mo, Sn, Ba and W or O; X is a halide ion selected from F, Cl and Br, wherein h, k, l and y3 are all $\geq 0$, and satisfy chemical coordination with z3.

10. The battery unit of claim 1, wherein
a positive electrode active material of the first cell comprises a lithium-containing phosphate represented by formula (III), $$LiFe_{1-x5-y5}Mn_{x5}M''_{y5}PO_4 \qquad \text{formula (III)}$$

wherein $0 \leq x5 \leq 1$, $0 \leq y5 \leq 0.1$, and M" is selected from one or more of transition metal elements, except Fe and Mn, and non-transition metal elements.

11. The battery unit of claim 1, wherein
a negative electrode active material of the first cell and a negative electrode active material of the second cell are independently selected from one or more of synthetic graphite, natural graphite, soft carbon, hard carbon, carbon doped with a heteroatom, carbon soil synthesized from biomass, graphene, silicon-based materials, tin-based materials, and lithium titanate; and
optionally, the negative electrode active material of the first cell and the negative electrode active material of the second cell have the same composition.

12. A battery pack, comprising the battery unit of claim 1.

13. A power consuming device, comprising the battery pack of claim 12, wherein the battery pack is used as a power supply or an energy storage unit of the power consuming device.

14. A method for manufacturing a battery unit, comprising the steps of:
obtaining a first cell type and a second cell type, wherein the first cell type includes N first cells,
the second cell type includes M second cells, and N and M are positive integers;

the first cell has a discharge cell balance rate of CB1, the second cell has a discharge cell balance rate of CB2, with 0.5≤CB1≤CB2≤1.4, and when the battery unit is charged to 95%-100% of the state of charge, the first cell has a corresponding open-circuit voltage change rate of not greater than 0.005 V/% SOC, and the second cell type has a corresponding open-circuit voltage change rate greater than that of the first cell; and electrically connecting the first cell type and the second cell type in a manner including a series connection, so as to form the battery unit of claim 1.

* * * * *